US007960770B2

(12) United States Patent
Mikawa et al.

(10) Patent No.: US 7,960,770 B2
(45) Date of Patent: Jun. 14, 2011

(54) NONVOLATILE MEMORY ELEMENT ARRAY WITH STORING LAYER FORMED BY RESISTANCE VARIABLE LAYERS

(75) Inventors: Takumi Mikawa, Shiga (JP); Takeshi Takagi, Kyoto (JP); Yoshio Kawashima, Osaka (JP); Koji Arita, Osaka (JP)

(73) Assignee: Panasonic Corporation, Osaka (JP)

( * ) Notice: Subject to any disclaimer, the term of this patent is extended or adjusted under 35 U.S.C. 154(b) by 119 days.

(21) Appl. No.: 12/445,380

(22) PCT Filed: Oct. 12, 2007

(86) PCT No.: PCT/JP2007/069966
§ 371 (c)(1),
(2), (4) Date: Apr. 13, 2009

(87) PCT Pub. No.: WO2008/047711
PCT Pub. Date: Apr. 24, 2008

(65) Prior Publication Data
US 2010/0090193 A1 Apr. 15, 2010

(30) Foreign Application Priority Data

Oct. 16, 2006 (JP) ................................. 2006-281080

(51) Int. Cl.
*H01L 29/76* (2006.01)
(52) U.S. Cl. . 257/295; 257/298; 257/314; 257/E27.104; 257/E21.663
(58) Field of Classification Search .................. 257/295, 257/298, 314, E27.104, E21.663; 365/65, 365/66, 72, 145
See application file for complete search history.

(56) References Cited

U.S. PATENT DOCUMENTS

| 5,621,247 | A | 4/1997 | Hirao et al. |
| 5,714,400 | A | 2/1998 | Hirao et al. |
| 2006/0181317 | A1 | 8/2006 | Joo et al. |
| 2008/0089121 | A1 | 4/2008 | Aochi et al. |

FOREIGN PATENT DOCUMENTS

| JP | 08-293686 | 11/1996 |
| JP | 2004-241756 | 8/2004 |
| JP | 2004-319587 | 11/2004 |
| JP | 2004-349689 | 12/2004 |
| JP | 2004-349690 | 12/2004 |
| JP | 2005-317976 | 11/2005 |
| JP | 2006-040946 | 2/2006 |
| JP | 2006-080259 | 3/2006 |
| JP | 2006-229227 | 8/2006 |
| JP | 2008-085071 | 4/2008 |

*Primary Examiner* — Thanh V Pham
(74) *Attorney, Agent, or Firm* — McDermott Will & Emery LLP

(57) ABSTRACT

A lower electrode (22) is provided on a semiconductor chip substrate (26). A lower electrode (22) is covered with a first interlayer insulating layer (27) from above. A first contact hole (28) is provided on the lower electrode (22) to penetrate through the first interlayer insulating layer (27). A low-resistance layer (29) forming the resistance variable layer (24) is embedded to fill the first contact hole (28). A high-resistance layer (30) is provided on the first interlayer insulating layer (27) and the low-resistance layer (29). The resistance variable layer (24) is formed by a multi-layer resistance layer including a single layer of the high-resistance layer (30) and a single layer of the low-resistance layer (29). The low-resistance layer (29) forming the memory portion (25) is isolated from at least its adjacent memory portion (25).

9 Claims, 19 Drawing Sheets (a)

(b)

(a)

(b)

NONVOLATILE MEMORY ELEMENT ARRAY WITH STORING LAYER FORMED BY RESISTANCE VARIABLE LAYERS

RELATED APPLICATIONS

This application is the U.S. National Phase under 35 U.S.C. §371 of International Application No. PCT/JP2007/069966, filed on Oct. 12, 2007, which in turn claims the benefit of Japanese Application No. 2006-281080, filed on Oct. 16, 2006, the disclosures of which Applications are incorporated by reference herein.

TECHNICAL FIELD

The present invention relates to a nonvolatile memory element array which is suitably adapted for miniaturization and an increase in a speed, and a manufacturing method thereof.

BACKGROUND ART

In recent years, with the advancement of digital technologies, higher functionality of electronic hardware such as portable information devices and information home appliances have been provided. With the progress of the higher functionality of the electronic hardware, miniaturization and an increase in a speed of semiconductor elements for use with them have been making rapid progress. Among them, applications of a nonvolatile memory element using a ferroelectric film or the like which is capable of writing and reading at a high speed with low electric consumption, as a material for a memory portion, have spread at a rapid pace.

Furthermore, since the nonvolatile memory element using a resistance variable layer as a material for a memory portion can constitute a memory element only by using a resistance variable element, further miniaturization, an increase in a speed, and lower electric power consumption of the nonvolatile memory element have been expected.

When using the resistance variable layer as the material for the memory portion, it is required that its resistance value change from a high-resistance value to a low-resistance value or from the low-resistance value to the high-resistance value by applying electric pulses such that these two values are clearly distinguished and the resistance value stably change. For the purpose of such stabilization of retention characteristic and miniaturization of the memory element, structures of the resistance variable layer have been disclosed.

FIG. 21 shows an example of a conventional memory element, in which a memory cell is formed by a resistance variable element having two storing layers which are sandwiched between two electrodes and whose resistance values change reversibly (see patent document 1, for example).

As shown in FIG. 21, the memory element consists of a number of resistance variable elements 10 forming memory cells and arranged in an array form. Each resistance variable element 10 has a structure in which a high-resistance layer 2 and an ion source layer 3 whose resistance is lower than a resistance of the high-resistance layer 2 are sandwiched between a lower electrode 1 and an upper electrode 4. The high-resistance layer 2 and the ion source layer 3 form a storing layer. The storing layer enables data to be stored in the resistance variable element 10 in each memory cell.

The resistance variable elements 10 are respectively disposed above MOS transistors 18 provided on a semiconductor substrate 11. The MOS transistor 18 includes source/drain regions 13 formed in a region separated by an isolating layer 12 inside the semiconductor substrate 11 and a gate electrode 14. The gate electrode 14 also serves as a word line which is one address wire of the memory element.

One of the source/drain regions 13 of the MOS transistor 18 is electrically connected to the lower electrode 1 of the resistance variable element 10 via a plug layer 15, a metal wire layer 16, and a plug layer 17.

The other of the source/drain regions 13 of the MOS transistor 18 is connected to the metal wire layer 16 via the plug layer 15. The metal wire layer 16 is connected to a bit line which is the other address wire of the memory element.

By applying electric potentials of different polarities between the lower electrode 1 and the upper electrode 4 of the resistance variable element 10 configured as described above, ion source of the ion source layer 3 forming the storing layer is caused to migrate to the high-resistance layer 2 or the ion source is caused to migrate from the high-resistance layer 2 to the upper electrode 4. Thereby, the resistance value of the resistance variable element 10 transitions from a value of a high-resistance state to a value of a low-resistance state, or from a value of the low-resistance state to a value of the high-resistance state, so that data is stored.

A memory element is also disclosed, in which a resistance variable layer material sandwiched between an upper electrode and a lower electrode is formed by a first electric pulse varying resistance layer having a polycrystalline structure and a second electric pulse varying resistance layer having a nano crystal structure or an amorphous structure. The resistance layer formed of this memory resistance material is controlled so that its resistance value is caused to change according to a voltage and pulse width of electric pulses applied, thereby operating as a resistance variable element (see, for example, patent document 2).

Patent document 1: Japanese Laid-Open Patent Application Publication No. 2006-40946
Patent document 2: Japanese Laid-Open Patent Application Publication No. 2004-349689

DISCLOSURE OF THE INVENTION

Problems to be Solved by the Invention

However, the above described conventional configurations are difficult to attain miniaturization of the elements and are not well adapted for mass production. In addition, further improvement of the retention characteristic is demanded.

The present invention is directed to solving the above described problems and proposes an element structure for enabling further miniaturization. An object of the present invention is to provide a nonvolatile memory element which is highly compatible with a semiconductor process adapted for further miniaturization in the future, is capable of improving retention characteristic as a memory portion, and is capable of stable mass production, and a manufacturing method thereof.

Means for Solving the Problems

To achieve the above object, the inventors studied intensively, and as a result, found the following.

There are materials capable of forming a low-resistance layer which is excellent in resistance varying characteristic, such as a material made of an iron oxide, which are different from the materials forming the low-resistance layers disclosed in the prior art documents. There existed a problem that if the resistance variable layer is formed by using only such a low-resistance layer which is excellent in the resistance varying characteristic, a large driving current flows because of the low resistance of the resistance variable layer, causing damage to the resistance variable layer, contacts with electrodes sandwiching the resistance variable layer and wires, when applying a voltage to the resistance variable layer. There also existed a problem that if the resistance value of the resistance variable layer is low during application of a forming voltage for the resistance variable layer, a voltage sufficient for the "forming" is not applied to the resistance variable layer, because of the relation of the resistance magnitude with a parasitic wire resistance. These problems are severe in view of ensuring reliability of the resistance variable layer.

The present invention uses as the resistance variable layer, a multi-layer resistance layer including a combination of a high-resistance layer with a low-resistance layer which is excellent in resistance varying characteristic. Because of such a structure, the resistance variable layer is allowed to have a proper resistance value so that the resistance variable layer can conduct a proper current which does not cause any damage and can be applied with a proper voltage during application of the forming voltage. In many cases, cross talk between adjacent electrodes is problematic if using the low-resistance layer as the resistance variable layer. However, by isolating at least the low-resistance layer, occurrence of the cross talk is suppressed.

It was found out that in such a structure, the retention characteristic of the element is improved by connecting the low-resistance layer to the high-resistance layer only at a portion of a main surface of the high-resistance layer. It was presumed that the improvement of the characteristic is due to suppressing of an influence of a leak current flowing outside the high-resistance layer.

As used herein, the terms "high-resistance layer" and "low-resistance layer" are expressed relatively to compare the resistance values in a laminated-layer structure of the resistance variable layer.

In order to achieve the above object, a nonvolatile memory element array of the present invention comprising a plurality of nonvolatile memory elements, each of the nonvolatile memory elements including a lower electrode provided on a substrate; an upper electrode provided above the lower electrode; and a resistance variable layer sandwiched between the lower electrode and the upper electrode; wherein the resistance variable layer includes a high-resistance layer and a low-resistance layer; wherein the resistance variable layer has a characteristic in which a resistance value of the resistance variable layer is increased or reduced by applying electric pulses between the lower electrode and the upper electrode; wherein the resistance variable layer is connected to the upper electrode only at a portion of a main surface of the upper electrode or connected to the lower electrode only at a portion of a main surface of the lower electrode; and wherein low-resistance layers in adjacent nonvolatile memory elements are isolated from each other.

In such a configuration, the resistance variable layer is allowed to have a proper resistance value so that the resistance variable layer can conduct a proper current and can be applied with a proper forming voltage. In addition, it is possible to attain an element structure capable of isolating adjacent memory cells to suppress occurrence of the cross talk and of realizing miniaturization. As used herein, the term "isolation" means that the associated layers of the elements (e.g., low-resistance layers of the elements) are isolated from each other by the interlayer insulating layer or the like.

In the nonvolatile memory element array, the low-resistance layer may be connected to the high-resistance layer only at a portion of a main surface of the high-resistance layer.

In such a configuration, it is possible to attain an element structure which is capable of suppressing the influence of the leak current in the high-resistance layer and of realizing miniaturization.

The nonvolatile memory element array may be a cross-point type nonvolatile memory element array in which a plurality of lower electrodes may be arranged to extend in parallel with each other within a first plane which is parallel to a main surface of the substrate, a plurality of upper electrodes may be arranged to extend in parallel with each other within a second plane which is parallel to the first plane and to three-dimensionally cross the lower electrodes, and the resistance variable layer may be provided between the lower electrode and the second electrode so as to correspond to each of three-dimensional cross points of the plurality of lower electrodes and the plurality of upper electrodes. Thereby, the nonvolatile memory element according to Claim 1 may be provided to correspond to each of the three-dimensional cross points.

In such a configuration, also, in the cross-point type nonvolatile memory element array, the resistance variable layer is allowed to have a proper resistance value so that the resistance variable layer can conduct a proper current and can be applied with a proper forming voltage. In addition, it is possible to attain an element structure capable of isolating memory cells located adjacent in two-dimensional manner to suppress occurrence of the cross talk and of realizing miniaturization.

In the nonvolatile memory element array, the high-resistance layer in adjacent nonvolatile memory elements may be provided to extend continuously.

In such a configuration, the influence of the leak current in the high-resistance layer can be suppressed more surely.

The nonvolatile memory element array may further comprise a first interlayer insulating layer provided on the substrate to cover the lower electrode. A first contact hole may be provided to penetrate through the first interlayer insulating layer on the lower electrode. The low-resistance layer may be provided inside the first contact hole.

In such a configuration, the first interlayer insulating layer is capable of more surely isolating the low-resistance layers in adjacent memory cells to suppress occurrence of the cross talk. Therefore, the nonvolatile memory element can have higher compatibility with an interlayer insulating layer forming step, an etching step, an embedding step of a deposited material and others in a planar process such as the conventional CMOS process.

In the nonvolatile memory element array, the high-resistance layer may be provided inside the first contact hole.

In such a configuration, since the resistance layer is completely physically isolated from its adjacent portion, it is possible to more surely prevent occurrence of the cross talk. By forming the resistance layer in a self-alignment manner, an advantage that manufacturing is simplified and a cost is reduced is achieved.

In the nonvolatile memory element array, the high-resistance layer may be provided so as to protrude from the first contact hole as viewed from a thickness direction of the first interlayer insulating layer.

In such a configuration, the influence of the leak current in the high-resistance layer can be suppressed more surely.

In the nonvolatile memory element array, the low-resistance layer may have a resistivity which is not lower than $1\times10^{-3}$ $\Omega$cm and not higher than $2\times10^{-2}$ $\Omega$cm.

In the nonvolatile memory element array, the high-resistance layer may have a resistivity which is not lower than 0.13 $\Omega$cm and not higher than 250 $\Omega$cm.

In the above configuration, the resistance variable layer can be applied with a proper forming voltage and a high hysteresis incidence of the resistance variable layer is attained. The data can be stored and read out according to change in the resistance value with lower electric power consumption.

In the nonvolatile memory element array, the low-resistance layer may be a layer containing $Fe_3O_4$.

In the nonvolatile memory element array, the high-resistance layer may be a layer containing at least one material which is selected from a group consisting of $Fe_2O_3$, $ZnFe_2O_4$, $MnFe_2O_4$, and $NiFe_2O_4$.

In the above configuration, the resistance variable layer can be applied with a proper forming voltage and a high hysteresis incidence of the resistance variable layer is attained. The data can be stored and read out according to change of the resistance value with lower electric power consumption. Further, during a continued operation, the high-resistance value and the low-resistance value can be respectively held at constant values. As a result, data can be stored or read out more stably.

The nonvolatile memory element array may further comprise an embedded insulating layer which is formed by an insulator embedded in the low-resistance layer. An upper surface of the embedded insulating layer may be connected to a lower surface of the high-resistance layer, and a side surface and lower surface of the embedded insulating layer may be covered with the low-resistance layer.

In the above configuration, since the region where the high-resistance layer and the low-resistance layer are in contact is limited to limit an operating region, the nonvolatile memory element is capable of operating at a lower current and with lower electric power consumption.

In order to achieve the above object, a method of manufacturing a nonvolatile memory element of the present invention comprises a step for forming a lower electrode on a substrate; a resistance layer forming step for forming a resistance variable layer including a low-resistance layer and a high-resistance layer on the lower electrode; and a step for forming an upper electrode on the resistance variable layer; wherein the resistance layer forming step includes: a step for forming a first interlayer insulating layer so as to cover the lower electrode; a step for forming a first contact hole on the lower electrode so as to penetrate through the first interlayer insulating layer; and a step for embedding the low-resistance layer to fill the first contact hole.

In such a configuration, the resistance variable layer is allowed to have a proper resistance value so that the resistance variable layer can conduct a proper current and can be applied with a proper forming voltage. In addition, it is possible to attain an element structure capable of isolating adjacent memory cells to suppress occurrence of the cross talk and of realizing miniaturization. Further, the method can have higher compatibility with an interlayer insulating layer forming step, an etching step, an embedding step of a deposited material and others in a planar process such as the conventional CMOS process.

In the method of manufacturing the nonvolatile memory element, the resistance layer forming step may further include a step for forming the high-resistance layer on a surface of the low-resistance layer such that the high-resistance layer is connected to the low-resistance layer only at a portion of a lower surface of the high-resistance layer.

In such a configuration, it is possible to attain an element structure which is capable of suppressing the influence of the leak current in the high-resistance layer and of realizing miniaturization.

In the method of manufacturing the nonvolatile memory element, the step for forming the high-resistance layer may include a step for embedding the high-resistance layer to fill the first contact hole in which the low-resistance layer is embedded.

In such a configuration, since the high-resistance layer is completely physically isolated from its adjacent portion, it is possible to more surely prevent occurrence of the cross talk. By forming the resistance layer in self-alignment manner, an advantage that manufacturing is simplified and a cost is reduced is achieved.

The method of manufacturing the nonvolatile memory element may further comprise a step for flattening a surface of the first interlayer insulating layer and a surface of the low-resistance layer. The step for forming the high-resistance layer may include forming the high-resistance layer on the surface of the first interlayer insulating layer and the surface of the low-resistance layer.

In such a configuration, since the high-resistance layer can be formed on the flattened substrate, a variation in the thickness of the high-resistance layer can be lessened, i.e., a variation in the resistance of the cells can be suppressed.

In the method of manufacturing the nonvolatile memory element, the step for embedding the low-resistance layer to fill the first contact hole may include a step for forming the low-resistance layer along a bottom surface and a side surface of the first contact hole; and a step for forming an embedded insulating layer inside the first contact hole provided with the low-resistance layer. The step for forming the high-resistance layer on the surface of the low-resistance layer such that the high-resistance layer is connected to the low-resistance layer only at a portion of the lower surface of the high-resistance layer may include a step for forming the high-resistance layer on a surface of the first interlayer insulating layer, the surface of the low-resistance layer, and a surface of the embedded insulating layer.

In such a configuration, the first interlayer insulating layer is capable of more surely isolating the low-resistance layers in adjacent memory cells. Therefore, the method can have higher compatibility with an interlayer insulating layer forming step, an etching step, an embedding step of a deposited material and others in the planar process such as the conventional CMOS process. In addition, since the region where the high-resistance layer and the low-resistance layer are in contact is limited by the embedded insulating layer so that an operating region is limited to the laminated layer region where the high-resistance layer and the low-resistance layer are in contact, the nonvolatile memory element is capable of operating at a lower current and with lower electric power consumption.

The above method of manufacturing the nonvolatile memory element may further comprise a step for flattening the surface of the first interlayer insulating layer, the surface of the low-resistance layer and a surface of the embedded insulating layer. The step for forming the high-resistance layer may be performed after the step for flattening the surface of the first interlayer insulating layer, the surface of the low-resistance layer and the surface of the embedded insulating layer.

In such a configuration, since the high-resistance layer can be formed on the flattened substrate, a variation in the thickness of the high-resistance layer can be lessened, i.e., a variation in the resistance of the cells can be suppressed.

In the method of manufacturing the nonvolatile memory element, the step for embedding the low-resistance layer to fill the first contact hole may include a step for removing a portion of the embedded insulating layer and a portion of the low-resistance layer to form a recess inside the first contact hole. The step for forming the high-resistance layer on the surface of the low-resistance layer such that the high-resistance layer is connected to the low-resistance layer only at a portion of the lower surface of the high-resistance layer may include a step for embedding the high-resistance layer to fill the recess.

In such a configuration, since the high-resistance layer is also embedded inside the first contact hole, it is possible to attain an element structure capable of further isolating adjacent memory cells and of realizing further miniaturization.

The above method of manufacturing the nonvolatile memory element may further comprise a step for flattening the surface of the first interlayer insulating layer and the surface of the high-resistance layer. The step for forming the upper electrode may be performed after the step for flattening the surface of the first interlayer insulating layer and the surface of the high-resistance layer.

In such a configuration, since the interface at which the upper electrode and the high-resistance layer are connected can improve a degree of flatness, a current flows to the resistance layer uniformly, and as a result, a more stable memory operation is attainable.

In the method of manufacturing the nonvolatile memory element, lower electrodes and upper electrodes may be formed in stripe shape, and the upper electrodes may be formed on the first interlayer insulating layer and the resistance variable layer so as to cross the lower electrodes.

In such a configuration, also, in the cross-point type nonvolatile memory element, it is possible to attain an element structure capable of isolating memory cells located adjacent in two-dimensional manner and of realizing further miniaturization.

The above and further objects, features and advantages of the present invention will more fully be apparent from the following detailed description of preferred embodiments with accompanying drawings.

Effects of the Invention

In the nonvolatile memory element of the present invention and the manufacturing method thereof, the resistance variable layer formed by a multi-layer resistance layer including at least a single layer of the high-resistance layer and at least a single layer of the low-resistance layer is sandwiched between the lower electrode and the upper electrode, and the low-resistance layer is isolated from at least its adjacent memory portion. In such a configuration, since the memory cells including adjacent memory portions are isolated more surely and compatibility with the planar process such as the conventional CMOS is attained, it is possible to attain an element structure capable of further miniaturization. In addition, since the low-resistance layer forming the resistance variable layer which serves as the memory portion has an isolated structure, a voltage to be applied to the high-resistance layer can converge at the memory portion, and as a result, the nonvolatile memory element is capable of operating at a low voltage and with low electric power consumption as compared to the configuration in which the low-resistance layer is continuous in two-dimensional manner.

In addition, since the memory portion is surrounded by the insulating layer with a low dielectric constant, it is not affected by the cross talk from the wires or adjacent lower electrode and upper electrode. In addition, since an interlayer insulating layer having a sufficient thickness is disposed between the wires or the lower electrode and the upper electrode, the memory portion is less affected by a parasitic capacitance of the wires, lower electrode, and upper electrode which are located adjacent. Therefore, the nonvolatile memory element which enables high-dense integration and stable operation and the manufacturing method thereof are attained.

In the cross-point type nonvolatile memory element and the manufacturing method thereof, it is possible to surely isolate the memory cells including the memory portions which are located adjacent in two-dimensional manner, the advantage similar to that described above is achieved.

By using the nonvolatile memory element of the present invention, the electronic hardware such as portable information devices or information home appliances can be made smaller in size and thinner.

BRIEF DESCRIPTION OF THE DRAWINGS

FIG. 1 is a view showing a nonvolatile memory element according to Embodiment 1 of the present invention, in which FIG. 1(a) is a view schematically showing a cross-point type nonvolatile memory element as viewed from a substrate surface and FIG. 1(b) is a cross-sectional view schematically showing the cross-section taken in the direction of arrows along line A-A of FIG. 1(a).

FIG. 2 is a cross-sectional view schematically showing a part B of the nonvolatile memory element of FIG. 1(b), as being enlarged, in which FIG. 2(a) is a cross-sectional view schematically showing the cross-section taken in the direction of arrows along line A-A of FIG. 2(a) and FIG. 2(b) is a schematic cross-sectional view as viewed from the direction of C of FIG. 2(a).

Figure 1:
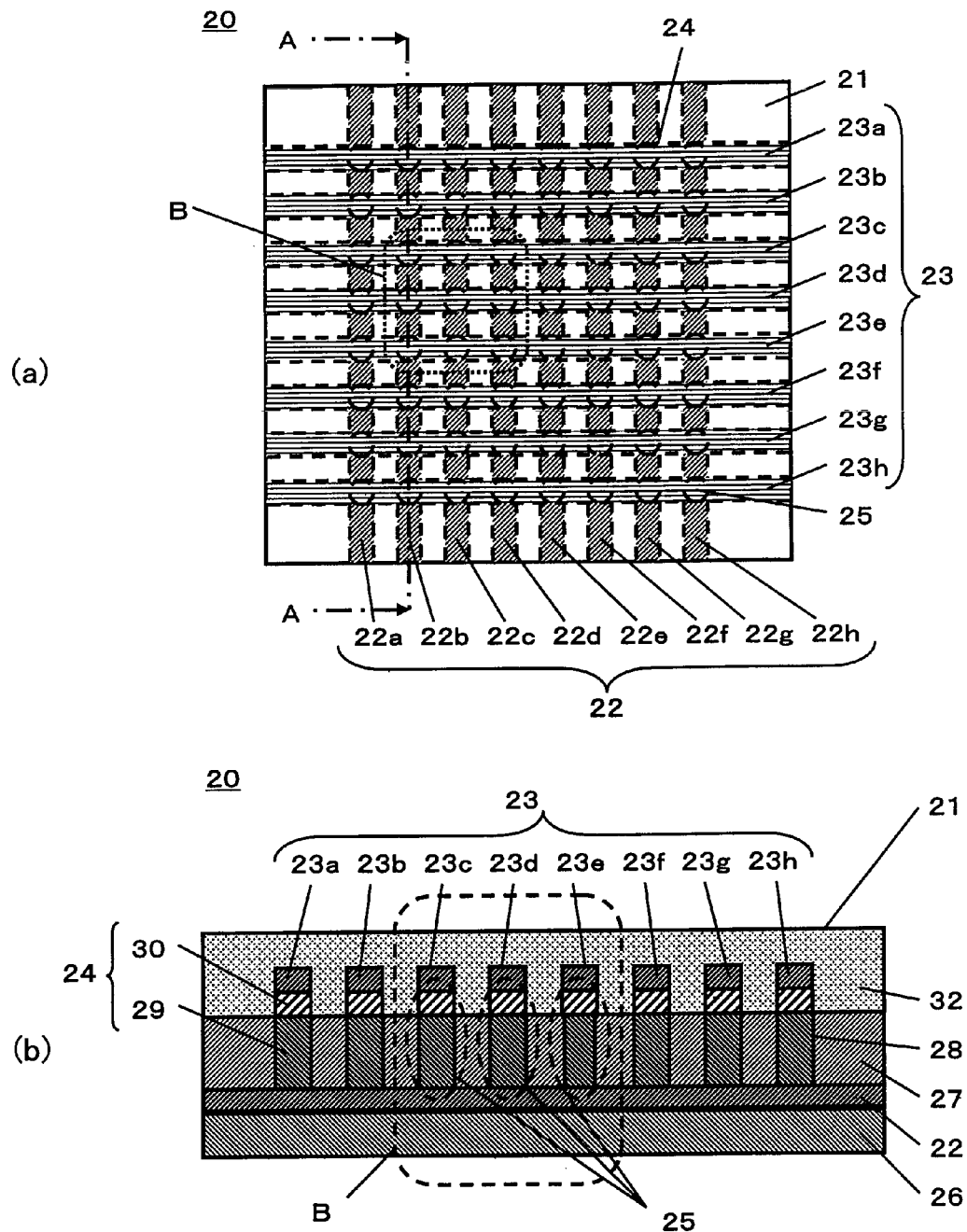
Figure 2:
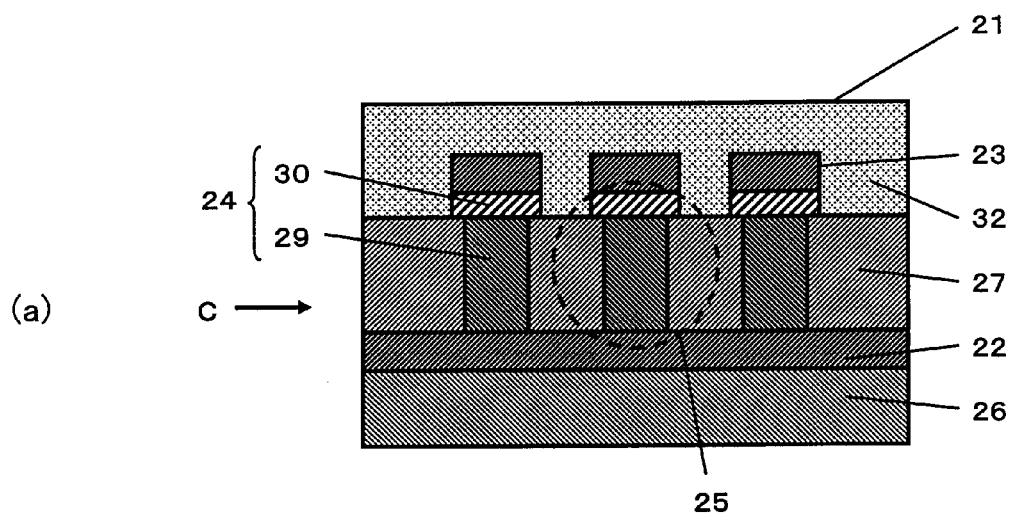
Figure 2:
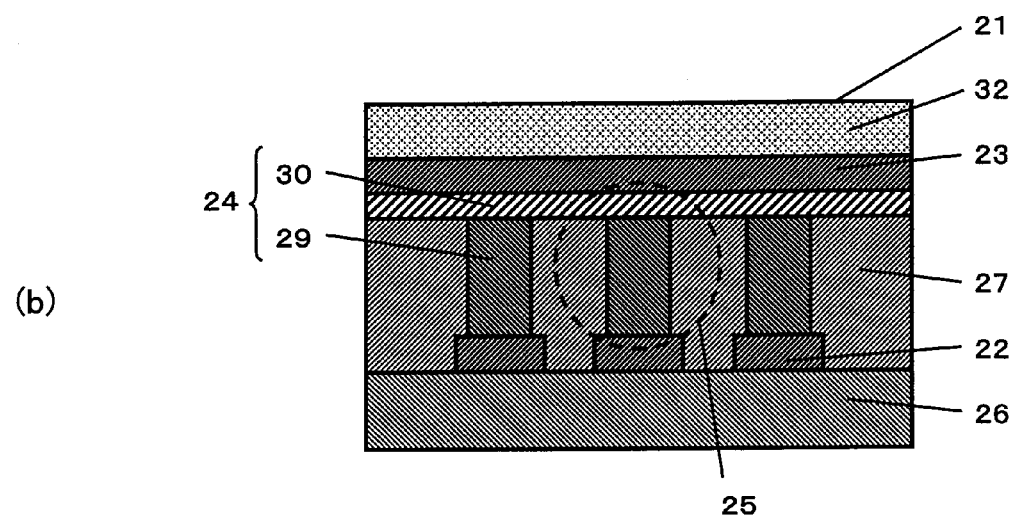

DESCRIPTION OF THE REFERENCE NUMERALS 20 nonvolatile memory element array
21 substrate surface
22, 22a, 22b, 22c, 22d, 22e, 22f, 22g, 22h lower electrode
23, 23a, 23b, 23c, 23d, 23e, 23f, 23g, 23h upper electrode
24, 36 resistance variable layer
25, 35 memory portion (nonvolatile memory element)
26 substrate
27 first interlayer insulating layer
28, 40 first contact hole
29, 38 low-resistance layer
30, 37, 43 high-resistance layer
32 second interlayer insulating layer
39 embedded insulating layer
41 hole
42 recess

BEST MODE FOR CARRYING OUT THE INVENTION

Hereinafter, a nonvolatile memory element and a manufacturing method thereof according to preferred embodiments of the present invention will be described with reference to the drawings. The components or constituents identified by the same reference numerals throughout the drawings will not be described repetitively in some cases.

Embodiment 1

FIGS. 1 to 8 are views showing Embodiment 1 of the present invention. FIG. 1(a) is a view schematically showing a configuration of a cross-point type nonvolatile memory element array 20 as viewed from a substrate surface 21 of a semiconductor chip. As shown in FIG. 1(a), the nonvolatile memory element array 20 has a structure in which, on a substrate, stripe-shaped lower electrodes 22 and stripe-shaped upper electrodes 23 crossing the lower electrodes 22 at a right angle are provided such that the lower electrodes 22 and the upper electrodes 23 sandwich resistance variable layers 24. In this embodiment, for example, eight lower electrodes 22 and eight upper electrodes 23 are illustrated, and a plurality of memory portions 25 are provided at points where the lower electrodes 22 and the upper electrodes 23 cross each other. Each of the plurality of memory portions (nonvolatile memory elements) 25 has a characteristic in which its resistance value is increased or reduced by application of electric pulses.

FIG. 1(b) is a cross-sectional view schematically showing the cross-section of the nonvolatile memory element array 20 taken in the direction of arrows along line A-A of FIG. 1(a). As shown in FIG. 1(b), the lower electrodes 22 are provided on the semiconductor chip substrate 26 and a first interlayer insulating layer 27 covers the lower electrodes 22 from above. First contact holes 28 are respectively provided on the lower electrodes 22 (so as to reach the lower electrodes 22 to penetrate through the first interlayer insulating layer 27, and low-resistance layers 29 forming the resistance variable layers 24 are embedded to fully fill the first contact holes 28, respectively. Further, high-resistance layers 30 and the upper electrodes 23 are provided on the first interlayer insulating layer 27 and the low-resistance layers 29. Each of resistance variable layers 24 is formed by a multi-layer resistance layer including a single layer of the high-resistance layer 30 and a single layer of the low-resistance layer 29. The high-resistance layers 30 are provided in stripe shape on the lower portions of the upper electrodes 23, respectively.

In other words, the nonvolatile memory element array 20 is configured in such a manner that the plurality of lower electrodes 22 are provided to extend in parallel with each other within a first plane parallel to a main surface of the substrate 26, the plurality of upper electrodes 23 are provided to extend in parallel with each other within a second plane parallel to the first plane and to three-dimensionally cross the plurality of lower electrodes 22, and the low-resistance layers 29 of the resistance variable layers 24 are provided between the lower electrode 22 and the upper electrode 23 to respectively correspond to three-dimensional cross points of the plurality of lower electrodes 22 and the plurality of upper electrodes, thereby providing the memory portions 25 to respectively correspond to the three-dimensional cross points.

As shown in FIG. 1(b), the low-resistance layer 29 forming the memory portion 25 is isolated from at least its adjacent memory portion 25. Forming the resistance variable layer 24 by a multi-layer resistance layer including at least a single layer of the high-resistance layer 30 and a single layer of the low-resistance layer 29 will suffice. The resistance variable layer 24 of FIG. 1(b) may be configured to include additional resistance layers.

On the high-resistance layers 30 forming the resistance variable layers 24, the upper electrodes 23, and the first interlayer insulating layer 27, a second interlayer insulating layer 32 is provided to cover the high-resistance layers 30 and the upper electrodes 23. The second interlayer insulating layer 32 protects the memory portions 25 of the nonvolatile memory element array 20.

In such a configuration, by applying electric pulses to the memory portion 25 via the lower electrode 22 and the upper electrode 23, the resistance value of the resistance variable layer 24 of the memory portion 25 is increased or reduced. According to the change of the resistance value, data is stored or read out. Therefore, it is possible to attain an element structure which is capable of isolating adjacent memory cells and of realizing further miniaturization. Also, in the cross-point type nonvolatile memory element array, it is possible to attain an element structure which is capable of isolating memory cells located adjacent in two-dimensional manner and of realizing further miniaturization.

FIG. 2(a) is a cross-sectional view schematically showing a part B of the nonvolatile memory element array which is a constituent unit of the cross-point type nonvolatile memory element array 20 shown in FIG. 1(b), the part B being illustrated as enlarged. In FIG. 2(a), the memory element array composed of, for example, three memory portions 25 is shown. It should be noted that the nonvolatile memory element array may be composed of the three memory portions 25. FIG. 2(b) is a schematic cross-sectional view of the memory element array composed of three memory portions 25 as viewed from the direction of C of FIG. 2(a).

As shown in FIG. 2(a), the resistance variable layers 24 sandwiched between the lower electrodes 22 and the upper electrodes 23, and the plural memory portions 25 consisting of the resistance variable layers 24 are provided on the substrate 26. As shown in FIG. 2(a), three memory portions 25 are provided. Each resistance variable layer 24 is formed by a multi-layer resistance layer including at least a single layer of the high-resistance layer 30 and a single layer of the low-resistance layer 29. The low-resistance layer 29 is isolated from at least its adjacent memory portion 25. Whereas in the configuration shown in FIG. 2(a), the resistance variable layer 24 is formed by two resistance layers consisting of a single layer of the high-resistance layer and a single layer of the low-resistance layer 29, it may be formed to include additional resistance layers.

In the above configuration, the resistance value of the resistance variable layer 24 in the memory portion 31 is increased or reduced by applying electric pulses to the memory portion 31 via the lower electrode 22 and the upper electrode 23. According to the change in the resistance value, data is stored or read out.

Since the resistance variable layer is a multi-layer resistance layer including the high-resistance layer as well as the low-resistance layer which is excellent in resistance varying characteristic, it is allowed to have a proper resistance value so that the resistance variable layer can conduct a proper current and can be applied with a proper forming voltage. When the resistance variable layers are formed into the memory element array, they make it possible to attain an element structure capable of isolating adjacent memory cells so as to suppress occurrence of cross talk and of realizing miniaturization. Furthermore, the resistance variable layer has higher compatibility with an interlayer insulating layer forming step, an etching step, an embedding step of a deposited material and others in a planar process such as the conventional CMOS.

To be specific, since the low-resistance layer of the resistance variable layer serving as the memory portion is connected to the high-resistance layer only at a portion of a main surface of the high-resistance layer, the voltage applied to the high-resistance layer can be caused to surely converge at the memory portion, attaining a low-voltage operation and a low-power consumption operation and improving retention characteristic of the element, as compared to a configuration in which the low-resistance layer is connected to the entire surface of the high-resistance layer.

In the configuration in which the resistance variable layers are formed into the memory element array, the memory portions are surrounded by the insulating layers with a low dielectric constant. Therefore, the memory cells including memory portions which are adjacent in two-dimensional manner can be surely isolated to prevent the memory portions from being adversely affected by the cross talk from the wires or their adjacent lower electrodes or upper electrodes. In addition, since the interlayer insulating layer having a sufficient thickness is provided between the wires, between the upper electrodes, and between the lower electrodes, the memory portions are less affected by a parasitic capacitance from the wires or lower electrodes and upper electrodes which are located adjacent. Therefore, a nonvolatile memory element array capable of high-dense integration and stable operation, and a manufacturing method thereof are attainable.

In a structure (structure in which the side wall surfaces of the resistance variable layers and the upper and lower electrodes are on the same plane) in which the resistance variable layer and the upper and lower electrodes are patterned in the same shape in the structure in which the resistance variable layer is sandwiched between the upper and lower electrodes, which is a commonly known structure, a problem that a leak-current flowing layer occurs due to etching in a side wall portion of the resistance layer, and electrons leak, thereby causing deterioration of the retention characteristic, tends to arise. The main cause of this is that when the electrodes and the resistance layer are etched together, a metal component of the electrode adheres to the side wall of the resistance layer, increasing a leak current. In this embodiment, the end surfaces of the lower electrode 22, the low-resistance layer 29, and the high-resistance layer 30 are not present on the same plane (the low-resistance layer 29 is connected to the lower electrode 22 only at a portion of the main surface of the lower electrode 22), and only the end surfaces of the high-resistance layer 30 and the upper electrode 23 are present on the same plane. Therefore, the aforesaid influence caused by the etching of the electrode does not occur on the end surface of at least the low-resistance layer 29. Thus, in principle, the problem that the retention characteristic is deteriorated can be avoided. Such an advantage is achieved by using a structure in which the resistance variable layer is connected to the upper electrode only at a portion of the main surface of the upper electrode or connected to the lower electrode only at a portion of the main surface of the lower electrode.

The use of the nonvolatile memory element of the present invention can achieve an advantage that electronic hardware such as portable information devices or information home appliance are made smaller in size and thinner.

Subsequently, the operation of the nonvolatile memory element with the configuration of FIG. 2(a) will be described.

Figure 3:
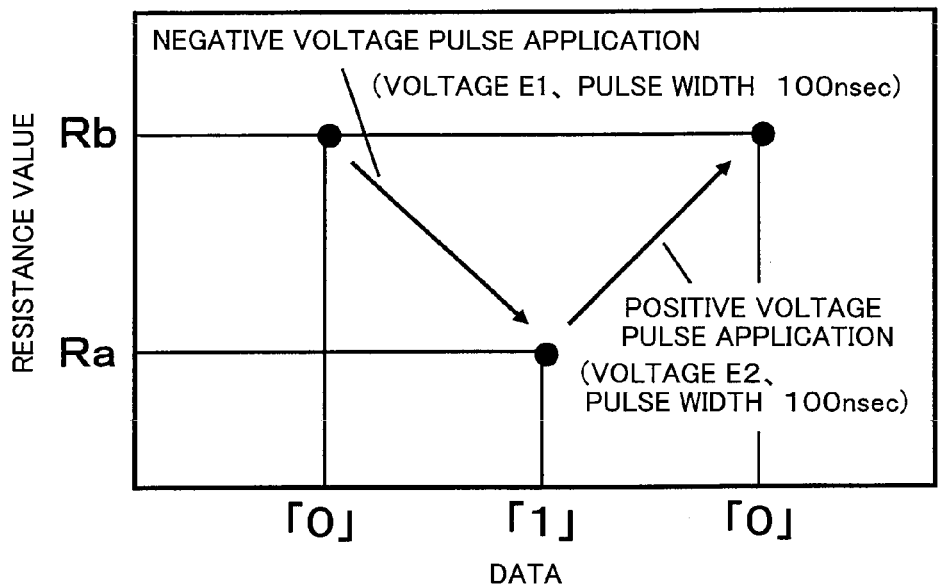
FIG. 3 is a schematic view showing how a resistance value of the nonvolatile memory element according to Embodiment 1 of the present invention changes.

FIG. 3 shows a change in the resistance value occurring when the electric pulses are applied to the resistance variable layer 24 of the nonvolatile memory element manufactured to have the structure of the schematic cross-section shown in FIG. 2(a). It should be noted that in an initial stage of measurement start immediately after forming the resistance variable layer 24, the resistance value of the resistance variable layer 24 is inconstant, and therefore, the resistance value of the resistance variable layer 24 after the operation for stabilizing the resistance value at a substantially constant value is performed, is shown.

When two kinds of electric pulses having different polarities and a pulse width of 100 nsec are applied alternately between the lower electrode 22 and the upper electrode 23, the resistance value of the resistance variable layer 25 sandwiched between the electrodes changes as shown in FIG. 3. To be specific, as shown in FIG. 3, when a negative voltage pulse (e.g., voltage E1, pulse width 100 nsec) is applied, the resistance value is reduced to a low-resistance value Ra of $(2.5 \times 10^3 \Omega)$, whereas when a positive voltage pulse (e.g., voltage E2, pulse width 100 nsec) is applied, the resistance value is increased to the high-resistance value Rb of $(1.1 \times 10^4 \Omega)$.

Figure 4:
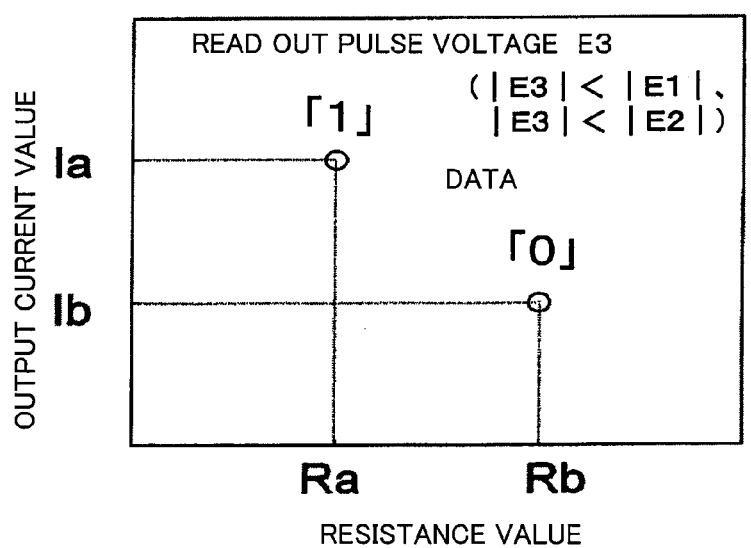
FIG. 4 is a view showing the relationship between two different resistance values and data "0" and data "1."
Figure 5:
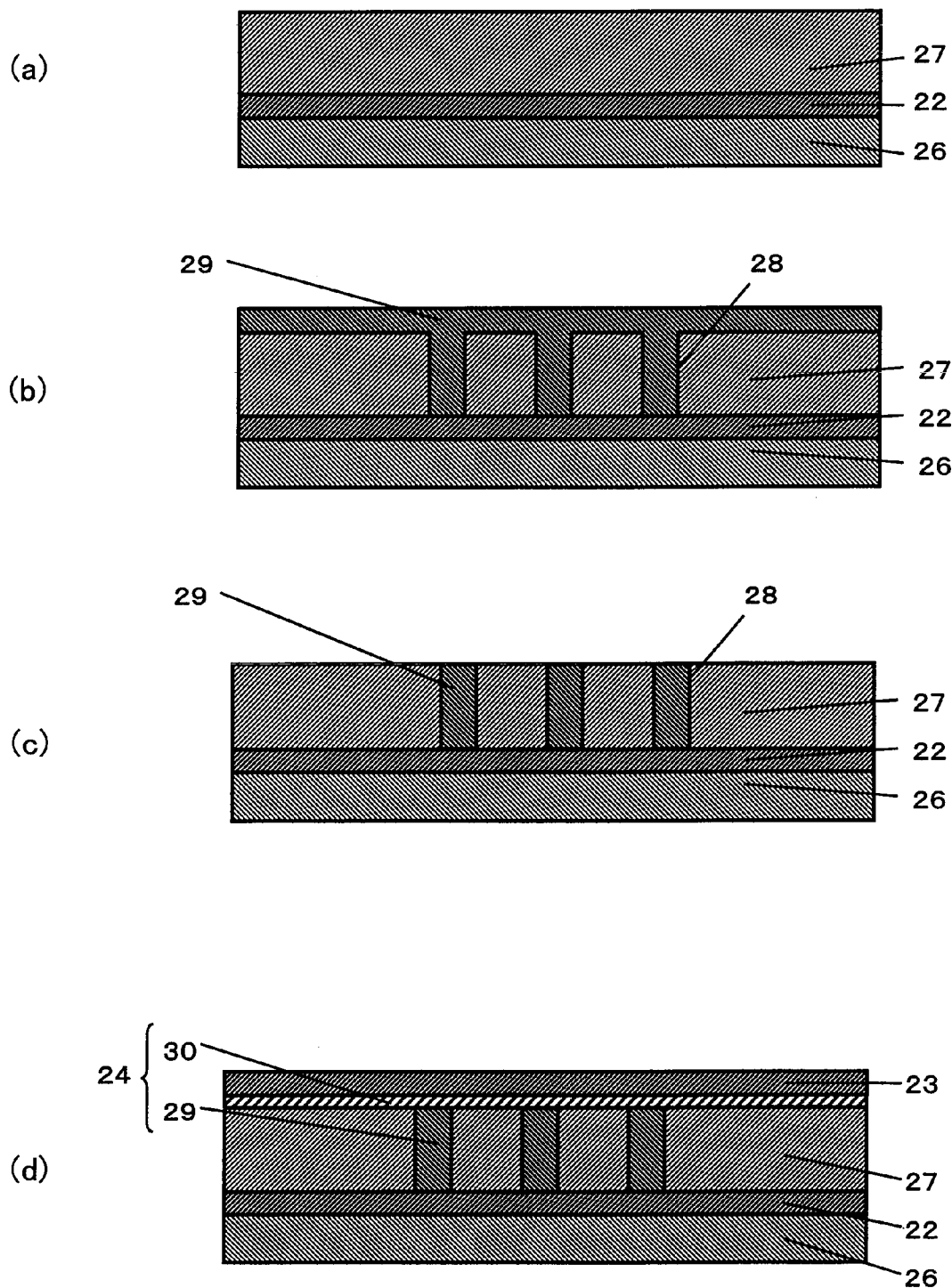
FIGS. 5(a) to 5(d) are step cross-sectional views showing a manufacturing method of the nonvolatile memory element used in Embodiment 1 of the present invention.
Figure 6:
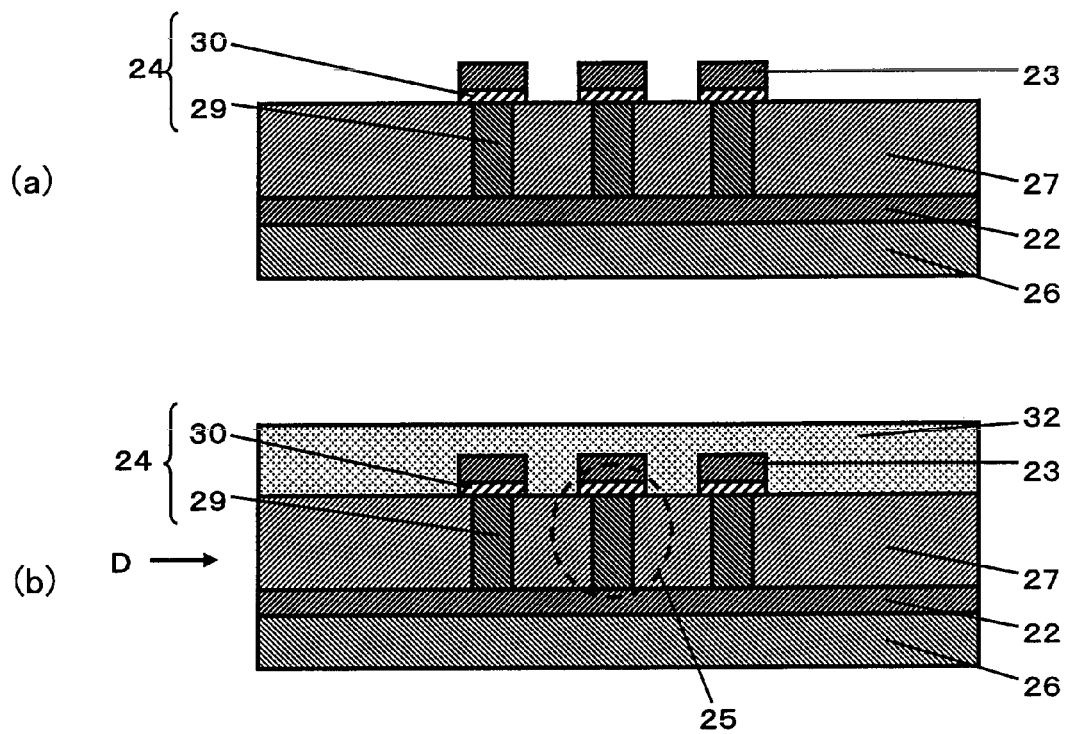
FIGS. 6(a) and 6(b) are step cross-sectional views showing a manufacturing method of the nonvolatile memory element used in Embodiment 1 of the present invention.

By allocating one of the two different resistance values Ra and Rb of the memory portion 25 to data "0" and the other to data "1" as shown in FIG. 4, the data "0" or the data "1" can be read according to determination as to whether the resistance value is "Ra" or "Rb". In the example shown in FIG. 4, the larger resistance value Rb is allocated to data "0" and the smaller resistance value Ra is allocated to data "1." As shown in FIG. 4, by applying the negative voltage pulse in the state where the resistance value of the memory portion 25 is Rb, the resistance value Ra is stored, and the data in the memory portion 25 is rewritten from "0" to "1." In the same manner, by applying the positive voltage pulse in the state where the resistance value of the memory portion 25 is Ra, the resistance value Rb is stored, and the data in the memory portion 25 is rewritten from "1" to "0."

When reading out the data, a reproducing voltage E3 whose amplitude is smaller than that of the electric pulses applied to change the resistance value of the resistance variable layer 24 is applied, and an output current value corresponding to the resistance value shown in FIG. 4 is read. Since an output current value Ia or Ib corresponds to the resistance value Ra or Rb, the data "0" or the data "1" is read as shown in FIG. 4. In the manner described above, a part of the resistance variable layers 24 operate as the memory portions 25 in regions where the lower electrodes 22 and the upper electrodes 23 cross each other, thereby enabling the nonvolatile memory element to operate.

As shown in FIGS. 1(a) and 1(b), the plurality memory portions 25 are formed such that the resistance variable layers 24 are sandwiched between the stripe-shaped lower electrodes 22 and the stripe-shaped upper electrodes 23. By arranging these memory portions 25 in matrix and operating them, the cross-point type nonvolatile memory element array 20 operates.

In this embodiment of the present invention, as the resistance variable layer, the multi-layer resistance layer including a combination of the high-resistance layer with the low-resistance layer which is excellent in resistance varying characteristic is used. Because of such a structure, the resistance variable layer is allowed to have a proper resistance value so that the resistance variable layer can conduct a proper current which does not cause any damage even when the voltage for the resistance change operation is applied and can be applied with a proper voltage during application of the forming voltage. In many cases, cross talk occurs between adjacent electrodes when using the low-resistance layer as the resistance variable layer. However, by isolating at least the low-resistance layer, occurrence of the cross talk is suppressed.

With such a configuration, the forming voltage applied in the initial stage of the start of the operation can be controlled to be a lower voltage. When storing or reading out the data according to the change in the resistance value, the resistance variable layer can conduct a proper current, rather than an excess current by incorporating the high-resistance layer. This enables the operation with low power consumption.

Subsequently, a manufacturing method of the nonvolatile memory element of FIG. 2(a) shown in this embodiment will be described. FIGS. 5(a) to 5(d) and FIGS. 6(a) and 6(b) sequentially show the process flow of the nonvolatile memory element shown in FIG. 2(a). To be specific, as sequentially shown in FIGS. 5 and 6, the manufacturing method of the nonvolatile memory element of this embodiment includes a step for forming the lower electrodes 22 on the substrate 26, a resistance layer forming step for forming the resistance variable layers 24 on the lower electrodes 22, and a step for forming the upper electrodes 23 on the resistance variable layers 24. The resistance layer forming step includes a step for forming the resistance variable layers 24 which are formed by multi-layer resistance layers each including at least a single layer of the high-resistance layer 30 and a single layer of the low-resistance layer 29 such that the low-resistance layers 29 in adjacent memory portions 25 are isolated from each other. Whereas the resistance variable layer 24 may be formed to include three or more layers as described above, a case where the resistance variable layer is formed by the resistance layer including two layers which are a single layer of the high-resistance layer 30 and a single layer of the low-resistance layer 29 will be described in this embodiment, by way of example.

As shown in FIG. 5(a), for example, the plurality of lower electrodes 22 made of Al material are formed on the substrate 26 made of Si material to extend in a predetermined direction, having a width of 0.1 μm and a thickness of 0.1 μm by a vapor deposition process and an etching process. In addition, by a CVD process or the like, a fluorine-doped oxide layer, which is the first interlayer insulating layer 27, is deposited to have a thickness of 200 nm, covering the substrate 26 and the lower electrodes 22.

Then, as shown in FIG. 5(b), the first contact holes 28 having a diameter of 0.08 μm are formed at intervals of 0.12 μm to penetrate through the first interlayer insulating layer 28 on the lower electrodes 22, by, for example, a dry etching process. A transition metal oxide layer material is fully filled in each first contact hole 28 by a sputtering process, thereby forming the resistance variable layer 29 formed of a low-resistance material made of, for example, $Fe_3O_4$ fully filled in the first contact hole 28. This material is also deposited in a layer form on the first interlayer insulating layer 27 as shown in FIG. 5(b).

Then, as shown in FIG. 5(c), a portion of the low-resistance layer 29 deposited on the first interlayer insulating layer 27 is removed using a CMP (chemical mechanical polishing) technique to expose the surface of the first interlayer insulating layer 27, leaving only a portion of the low-resistance layer 29 deposited in the first contact hole 28. Then, as shown in FIG. 5(d), on the low-resistance layer 29 and the first interlayer insulating layer 27 which have been flattened by the CMP technique, the high-resistance layer 30 made of, for example, $Fe_2O_3$ and having a thickness of 10 nm is formed by a sputtering process, and then the upper electrode 23 made of Al material is deposited to have a thickness of 0.1 μm on the upper portion of the high-resistance layer 30 by, for example, a vapor deposition process.

Then, as shown in FIG. 6(a), the stripe-shaped upper electrodes 23 are formed by photolithography to have a width of 0.1 μm and an interval of 0.1 μm and to cross the lower electrodes 22 at a right angle, and then the stripe-shaped high-resistance layers 30 are formed to have a width of 0.1 μm and an interval of 0.1 μm by, for example, dry etching, using the stripe-shaped upper electrodes 23 as a mask.

Then, as shown in FIG. 6(b), on the first interlayer insulating layer 27, a fluorine-doped oxide layer having a thickness of 0.3 μm is deposited as the second interlayer insulating layer 32 by the CVD process, so as to cover the high-resistance layers 30 and the upper electrodes 23, for example.

Figure 7:
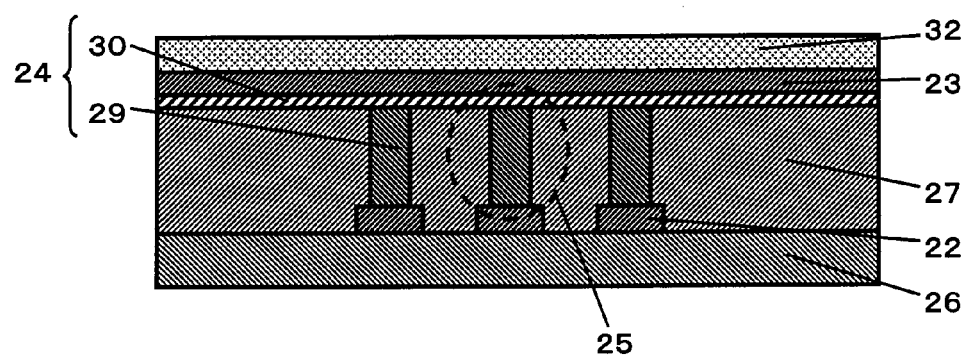
FIG. 7 is a step cross-sectional view showing a manufacturing method of the nonvolatile memory element used in Embodiment 1 of the present invention, as viewed from the direction of D of FIG. 6(b).

FIG. 7 shows a schematic cross-sectional view of the nonvolatile memory element array according to this embodiment, as viewed from the direction of D of FIG. 6(b). It can be seen that the stripe-shaped high-resistance layers 30 and the stripe-shaped upper electrodes 23 are arranged so as to cross the lower electrodes 25 at a right angle, thus forming the cross-point type nonvolatile memory element array.

Alternatively, the high-resistance layer 30 as well as the low-resistance layer 29 may be embedded to fill the first contact hole 28 such that each of the low-resistance layer 29 and the high-resistance layer 30 may have an isolated structure. The manufacturing method of the nonvolatile memory element having such a structure is shown sequentially by a process flow from FIGS. 8(a) to 8(d) and from FIGS. 9(a) to 9(d).

The process flow from FIGS. 8(a) to 8(c) is identical to the process flow from FIG. 5(a) to FIG. 5(c) and will not be described. As shown in FIG. 8(c), as in the step shown in FIG. 5(c), the stripe-shaped lower electrodes 22 are formed on the substrate 26 and the low-resistance layer 29 is deposited and embedded to fully fill each first contact hole 28 formed in the first interlayer insulating layer 27 deposited to cover the stripe-shaped lower electrodes 22 on the lower electrode 22.

Then, a portion of the low-resistance layer 29 which is located in the upper portion of each first contact hole 28 is removed using the CMP technique or the dry etching technique, forming a recess having a depth of 10 nm as shown in FIG. 8(d). Then, as shown in FIG. 9(a), the $Fe_2O_3$ material is deposited on the first interlayer insulating layer 27 so as to fully fill and cover the recess by, for example, the sputtering process, thus depositing the high-resistance layer 30. The high-resistance layer 30 is embedded to fully fill the recess and left in the recess inside the first contact hole 28 and the portion on the first interlayer insulating layer 27 is removed by the CMP technique, forming the cross-sectional shape shown in FIG. 9(b).

Then, as shown in FIG. 9(c), the upper electrode 23 is deposited on the first interlayer insulating layer 27 and the high-resistance layer 30 by, for example, the vapor deposition process and then the stripe-shaped upper electrodes 23 are formed to cover the high-resistance layers 30 and cross the lower electrodes 22 at a right angle. At this time, the upper electrodes are formed to have a width of 0.1 μm, an interval of 0.1 μm and a thickness of 0.1 μm. Then, as shown in FIG. 9(d), the second interlayer insulating layer 32 which is formed of a fluorine-doped oxide layer and has a thickness of 0.3 μm is formed on the upper electrodes 23 and the first interlayer insulating layer 27 by the CVD process, for example.

Figure 8:
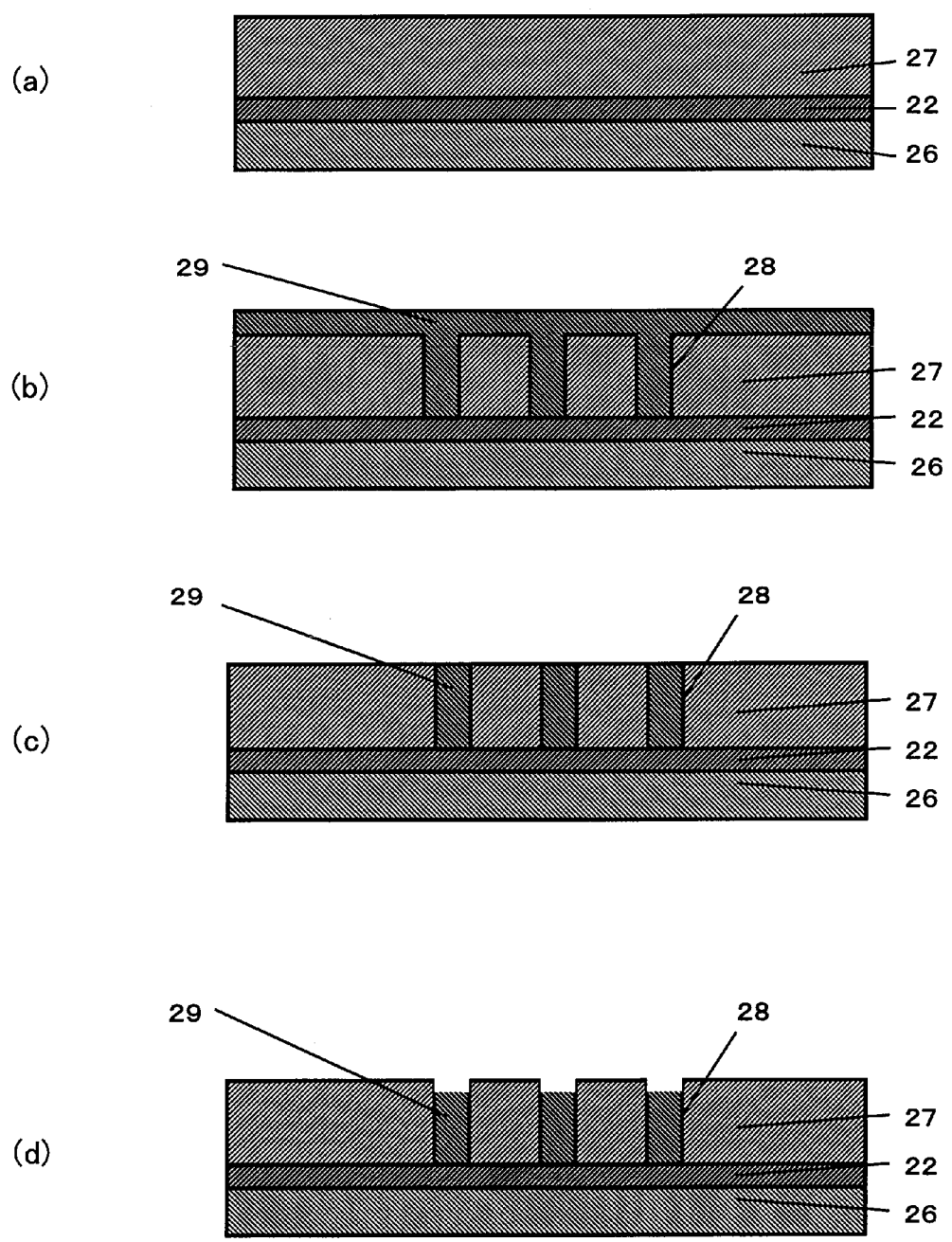
FIGS. 8(a) to 8(d) are step cross-sectional views showing a manufacturing method of the nonvolatile memory element in which a high-resistance layer is embedded, which is used in Embodiment 1 of the present invention.
Figure 9:
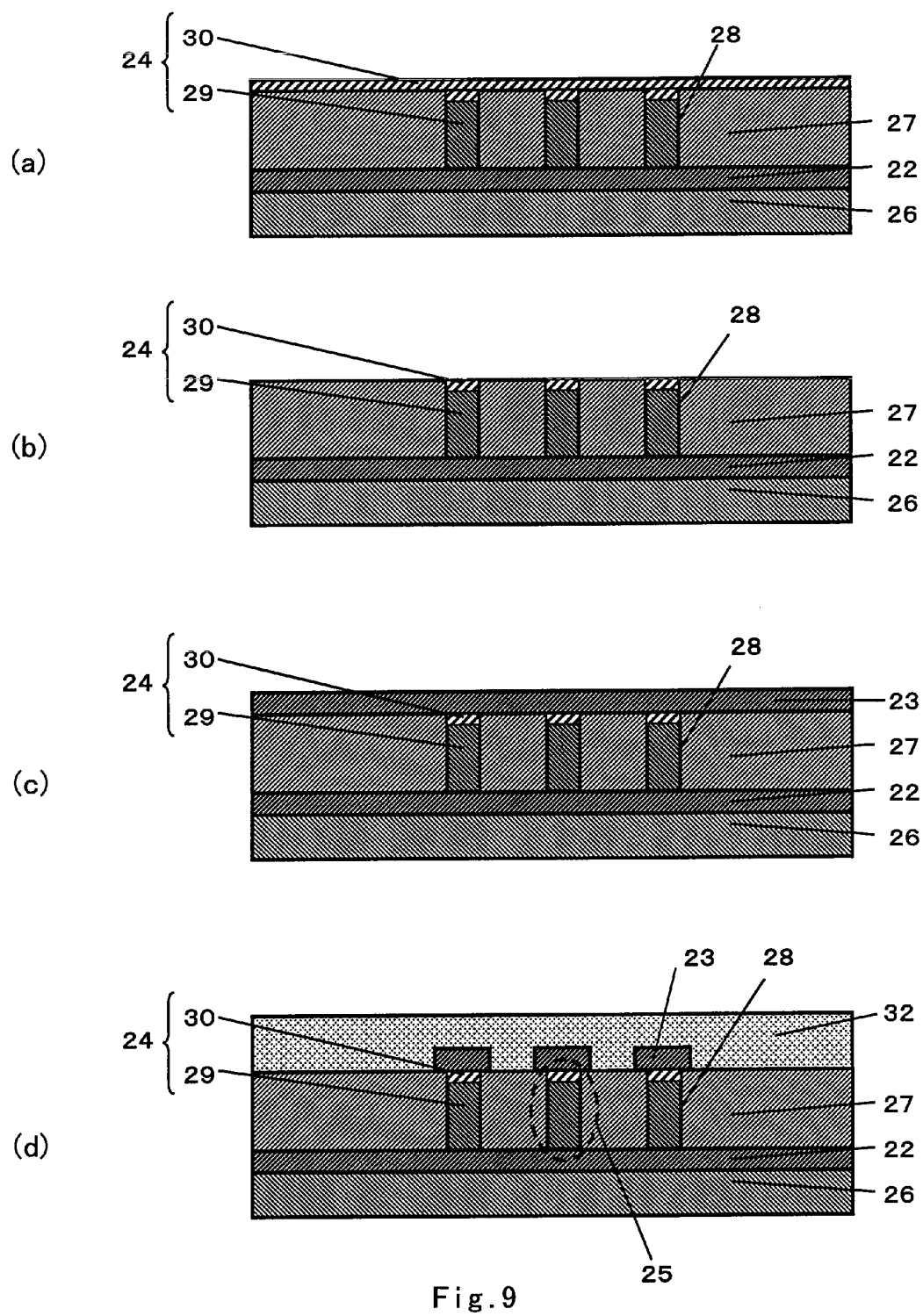
FIGS. 9(a) to 9(d) are step cross-sectional views showing the manufacturing method of the nonvolatile memory element in which the high-resistance layer is embedded, which is used in Embodiment 1 of the present invention.

Through the above described process flow shown in FIGS. 8 and 9, the nonvolatile memory element including the resistance variable layers 24 each having a structure in which the low-resistance layer 29 and the high-resistance layer 30 are embedded to fully fill the first contact hole 28 and formed to have an isolated structure is manufactured.

Through the above described process flow, the nonvolatile memory element array 20 is manufactured. Through the manufacturing process, the memory portion 25 including a portion of the resistance variable layer 24 shown in FIG. 6(b), FIG. 7 or FIG. 9(d) is limited to the region where the resistance variable layer 24 is sandwiched between the lower electrode 22 and the upper electrode 23 and to the region where the low-resistance layer 29 isolated by the first interlayer insulating layer 27 is disposed. The low-resistance layer 29 is formed in the first contact hole 28 penetrating through the first interlayer insulating layer 27 on the lower electrode 22. Therefore, the low-resistance layer 29 is miniaturized to a minimum size in a process rule of the manufacturing process. In addition, since the lower electrode 22 and the upper electrode 23 are formed within the first and second interlayer insulating layers, respectively, they can be formed by a mask process (e.g., CMOS process) identical to that for forming functional constituents of the nonvolatile memory element array other than the memory portions. Furthermore, the resistance variable layer 24, i.e., the low-resistance layer 29 and the high-resistance layer 30 can be formed using a normal semiconductor planar process. Moreover, since the surfaces of the layers are flattened using the CMP technique before every layer forming step, a close contact state and electric connection state between the layers are favorable.

Therefore, an element structure which is capable of isolating adjacent memory cells and of realizing further miniaturization is attainable. In addition, in the cross-point type nonvolatile memory element array, an element structure which is capable of isolating memory cells located adjacent in two-dimensional manner and of realizing further miniaturization is attainable. Furthermore, the first interlayer insulating layer is capable of surely isolating the low-resistance layers in the adjacent memory cells. Thus, the element structure has compatibility with the interlayer insulating layer forming step, the etching step, and the embedding step of the deposited material in the planar process such as the conventional CMOS.

Figure 10:
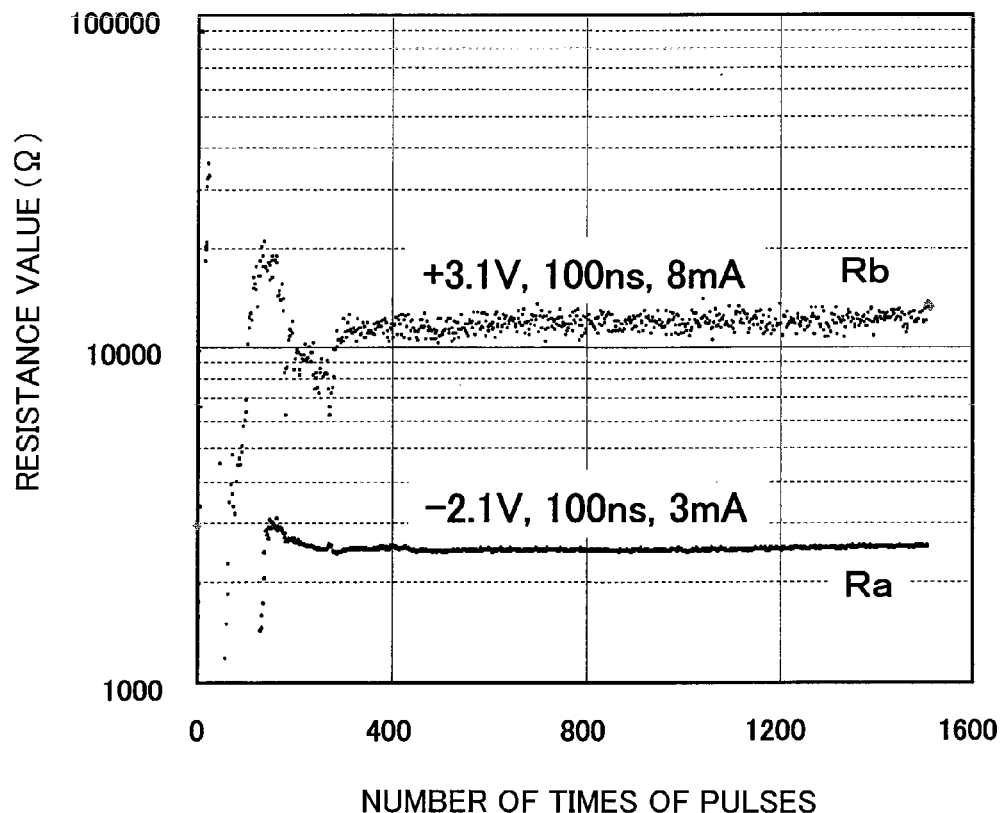
FIG. 10 is a view showing an operation characteristic of the nonvolatile memory element according to Embodiment 1 of the present invention.

Subsequently, the operation characteristic of the nonvolatile memory element manufactured by the above process flow is shown. FIG. 10 is view showing an operation characteristic of the nonvolatile memory element in this embodiment of the present invention. FIG. 10 shows that the resistance value changes by alternately applying electric pulses having different polarities between the lower electrode and the upper electrode of the nonvolatile memory element manufactured. The electric pulses are a positive pulse of +3.1V and a negative pulse of −2.1V each having a pulse width of 100 nsec.

As shown in FIG. 10, the resistance value is unstable from first pulse application to about 300 times pulse application, but after the 300 times pulse application, the high-resistance value Rb is substantially stable at 11KΩ and the low-resistance value is substantially stable at 2.5KΩ. In addition, a high-speed and low-voltage operation in which a pulse width is 100 nsec and a voltage is ±3.3V or lower is attained. Such a high-speed operation is effectively attained by the fact that a sufficient voltage is applied to the resistance variable layer by connecting the high-resistance layer to the low-resistance layer.

Figure 11:
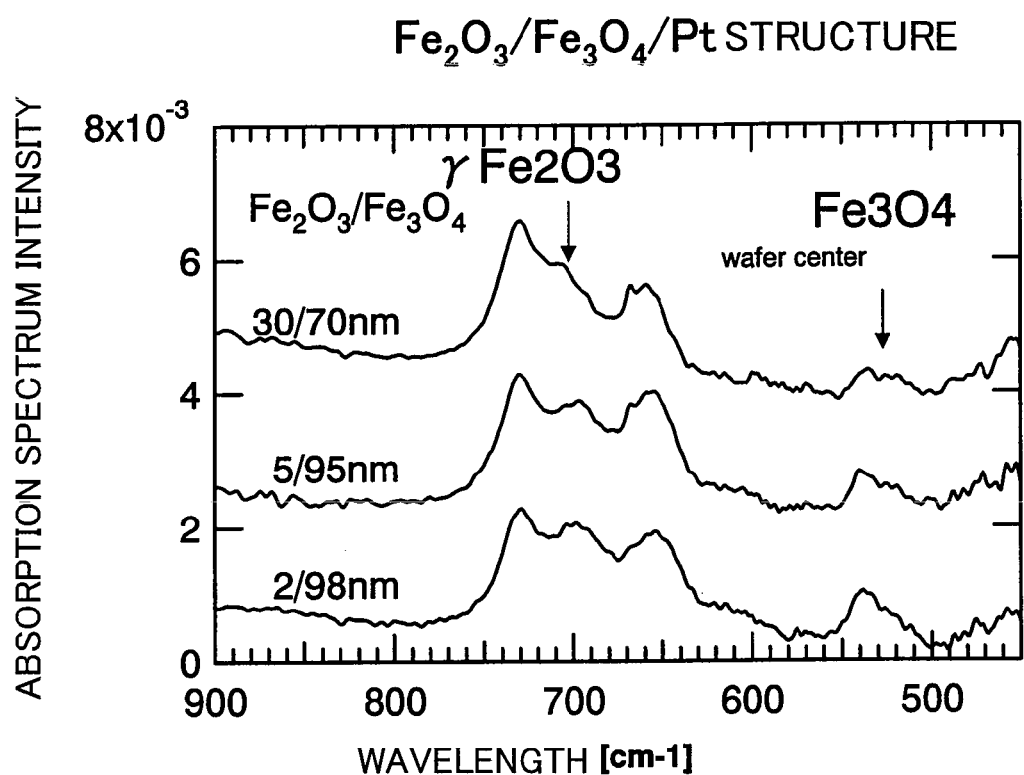
FIG. 11 is a view showing a FT-IR spectrum of a laminated structure of the resistance variable layer.

FIG. 11 shows FT-IR spectra of the laminated structures in which the thickness of the high-resistance layer and the thickness of the low-resistance layer of the resistance variable layer are made different. The high-resistance layer is made of a resistance material of $Fe_2O_3$ and the low-resistance layer is made of a resistance material of $Fe_3O_4$. In the laminated structures, spectra of γ $Fe_2O_3$ and $Fe_3O_4$ are observed. From this, it is found that the high-resistance layer and the low-resistance layer are laminated in a well isolated state even when the thickness of laminated layers is small. Therefore, by applying the electric pulses having different polarities, the resistance value can stably take the high-resistance value and the low-resistance value. The reason why the resistance value can change stably may be due to the fact that coordination or vacant lattice of Fe ions are changed by application of electric pulses in the layers forming the resistance variable layer.

Figure 12:
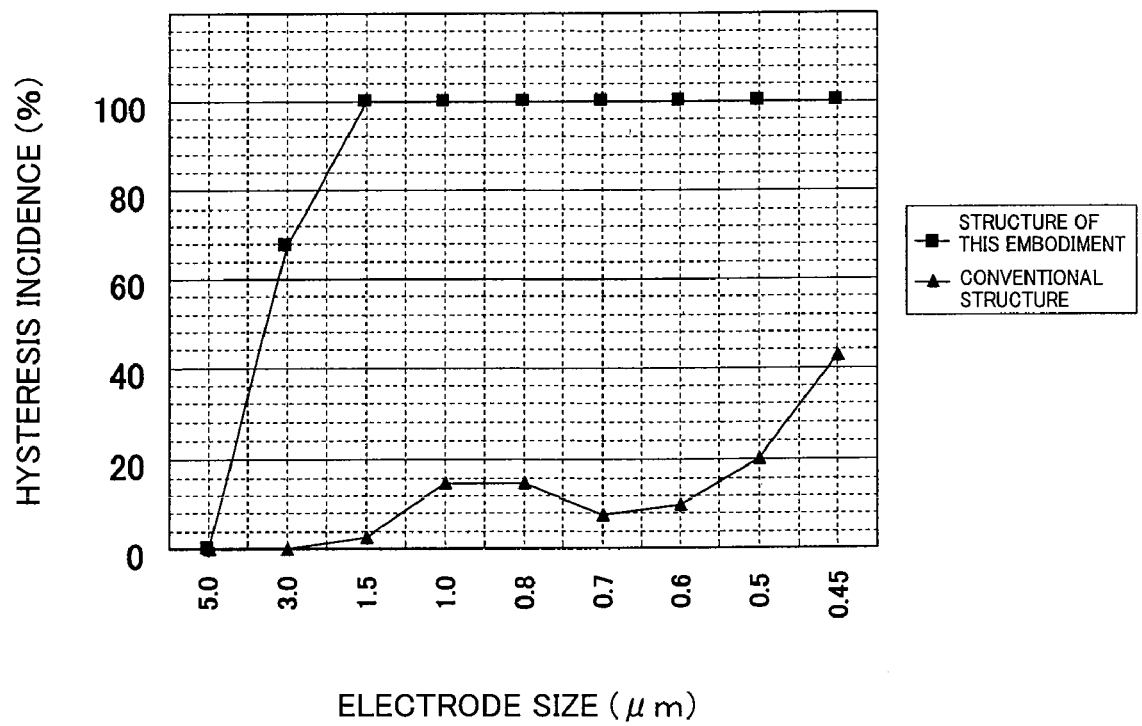
FIG. 12 is a view showing a hysteresis incidence of the nonvolatile memory element according to Embodiment 1 of the present invention.

It is assumed that a region where the resistance variable layer including the high-resistance layer and the low-resistance layer is sandwiched between the lower electrode and the upper electrode is a cell. Also, it is assumed that a state where cells having different initial resistances, i.e., different electrode diameter sizes can surely take the low-resistance values or the high-resistance values every time the electric pulse is applied are a state where the hysteresis occurs. In this case, the ratio of the cells with the hysteresis occurring therein to a number of cells within each of different lots corresponding to the cells with different electrode diameters, which is represented by a percentage, is converted into a numeric value as a hysteresis incidence. FIG. 12 shows dependency between the cell electrode diameter and the hysteresis incidence with the size of cell electrode diameter being on a horizontal axis and the hysteresis incidence being on a vertical axis. The shape of the electrodes is a square and the length of one side of the square is "cell size" in FIG. 12. As the conventional structure, the resistance variable layer consisting of a single layer of the low-resistance layer is used. As can be seen from FIG. 12, the hysteresis incidence is 50% or lower in the conventional structure, whereas in the structure of this example (structure shown in FIG. 2), the hysteresis incidence is 100% in a range in which the electrode diameter is 1.5 μm or smaller, and therefore, the memory element stably operates.

Figure 13:
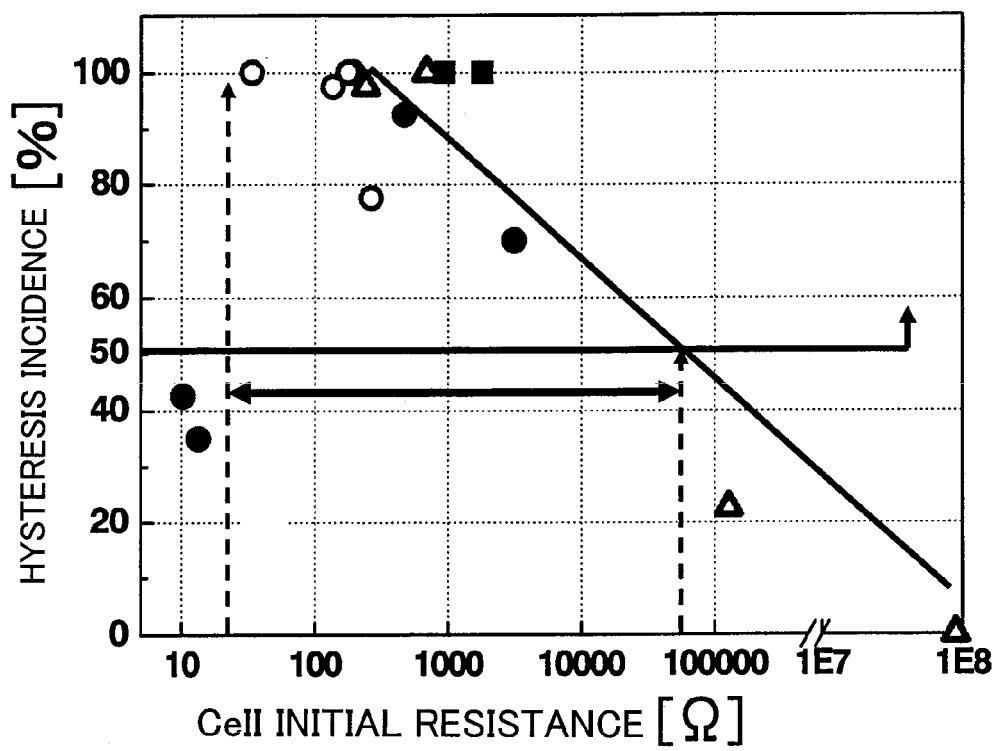
FIG. 13 is a view showing the relationship between a cell initial resistance value and the hysteresis incidence in the nonvolatile memory element according to Embodiment 1 of the present invention.

FIG. 13 is a view showing the relationship between the initial resistance value of the cells and the hysteresis incidence, the cells including the resistance variable layers having an area of 0.5 μm square. FIG. 13 shows the measurement values for the resistance elements which are formed by the resistance variable layers each including the high-resistance layer and the low-resistance layer and having a total thickness of 100 nm, the thickness of the high-resistance layer occupying 5% of the resistance variable layer. In FIG. 13, Δ○●■ correctively indicates data of lots in the case where the high-resistance layers are made of the materials having various resistivities.

As can be seen from FIG. 13, a tendency that the hysteresis incidence rises as the cell resistance increases in a range in which the cell resistance is between 10Ω and 100Ω is observed. This is due to the fact that a sufficient voltage is applied to the resistance variable layer under a smaller influence of parasitic wire resistance. On the other hand, when the cell resistance is 1000Ω or higher, the hysteresis incidence decreases. This may be due to the fact that because the resistance variable layer shows characteristic close to that of an insulator, the resistance variable layer is difficult to conduct a current and thus is not applied with sufficient energy, increasing a likelihood that resistance variable layer is difficult to change the resistance.

When the measure of the easiness or difficulty with which the resistance changes is expressed using as a reference 50% of the hysteresis incidence in FIG. 13, the initial resistance value of the cells which easily changes resistance is 25Ω to 50000Ω as can be seen from FIG. 13.

Assuming that most of the voltage applied to the resistance variable layer is applied to the high-resistance layer, resistivity ρL of the high-resistance layer in the case where the initial resistance value is 25Ω:

$$\rho L \ [\Omega \ cm] = (\text{cell resistance}) \times (\text{area}) \div (\text{thickness})$$
$$= 25 \ [\Omega] \times \frac{(0.5 \times 10^{-4} \ [cm] \times 0.5 \times 10^{-4} \ [cm])}{(5 \times 10^{-7} \ [cm])}$$
$$= 0.125 \ [\Omega \ cm]$$

When resistivity ρH of the high-resistance layer in the case where the initial resistance value is 50000Ω:

$$\rho H \ [\Omega \ cm] = (\text{cell resistance}) \times (\text{area}) \div (\text{thickness})$$
$$= 50000 \ [\Omega] \times \frac{(0.5 \times 10^{-4} \ [cm] \times 0.5 \times 10^{-4} \ [cm])}{(5 \times 10^{-7} \ [cm])}$$
$$= 250 \ [\Omega \ cm]$$

From the above, in the case where $Fe_2O_3$ is used for the high-resistance layer as in this embodiment, the resistivity is determined by a lower limit value of the material, and a desirable range of the resistivity of the high-resistance layer is not lower than 0.13 Ωcm and not higher than 250 Ωcm.

Whereas in this embodiment, $Fe_3O_4$ is used for the material of the low-resistance layer, a transition metal oxide may be used so long as it shows similar characteristic. It is desirable to use the low-resistance layer with a resistivity which is not lower than 1×10-3 Ωcm and not higher than 2×10-2 Ωcm. This resistivity range is a resistivity range in the case where $Fe_3O_4$ which is the low-resistance layer material is assumed to have an inverse-spinel structure as a crystalline structure.

Whereas in this embodiment, $Fe_2O_3$ is used for the material of the high-resistance layer, a transition metal oxide, for example, a spinel structure oxide such as $ZnFe_2O_4$, $MnFe_2O_4$ or $NiFe_2O_4$ may be used so long as it shows similar characteristic. It is desirable to use the high-resistance layer with a resistivity which is not lower than 0.13 Ωcm and not higher than 250 Ωcm. This resistivity range is a resistivity range in the case where $Fe_2O_3$ or the like which is the high-resistance layer material is assumed to have an inverse-spinel structure as a crystalline structure.

Whereas Al or W is used as the wire material, Pt or Cu used in the semiconductor process may be used.

Whereas W is used as the electrode material, other electrode materials Cu, Pt, Al, TiN, TaN, TiAlN, etc may be used.

Embodiment 2

Figure 14:
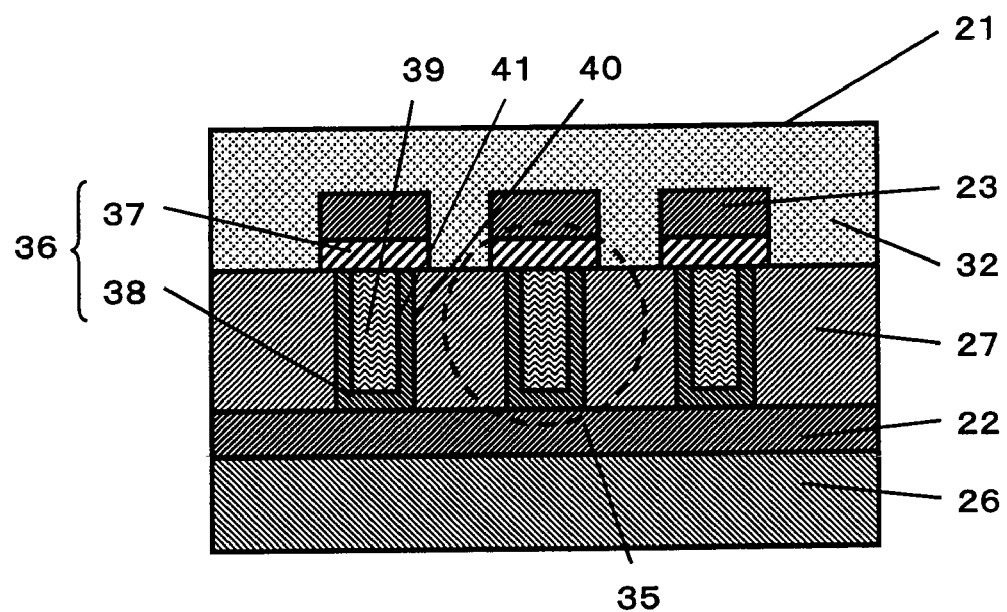
FIG. 14 is a schematic cross-sectional view showing a nonvolatile memory element according to Embodiment 2 of the present invention.

FIG. 14 is a schematic cross-sectional view showing Embodiment 2 of the present invention.

As shown in FIG. 14, on the substrate 26, resistance variable layers 36 which are sandwiched between the lower electrodes 22 and the upper electrodes 23, and a plurality of memory portions 35 (nonvolatile memory elements) respectively including the resistance variable layers 36 are formed. In the structure of FIG. 14, three memory portions 35 are formed. The resistance variable layers 36 are each formed by a multi-layer resistance layer including at least a single layer of the high-resistance layer 37 and a single layer of the low-resistance layer 38, and the low-resistance layer 38 is isolated from at least its adjacent memory portion 35. This embodiment is different from Embodiment 1 in a structure for connecting the high the high-resistance layer 37 and the low-resistance layer 38, in which an embedded insulating layer contacting the upper electrode is embedded inside the low-resistance layer and the low-resistance layer is in contact with the high-resistance layer in an annular form so as to surround the embedded insulating layer so that the high-resistance layer is connected to the low-resistance layer only at a portion of a lower surface of the high-resistance layer. As shown in FIG. 14, the high-resistance layer 37 is in contact with the low-resistance layer 38 at a surface thereof having a flat cross-sectional shape, while the low-resistance layer 38 is in contact with the high-resistance layer 37 at a surface thereof having a cross-sectional shape formed by rotating 90 degrees a U-shape which opens leftward (e.g., an upper end surface of a cup). That is, as shown in FIG. 14, the upper surface of the embedded insulating layer 39 is covered with the lower surface of the high-resistance layer 37, while the side surface and lower surface of the embedded insulating layer 39 are covered with the low-resistance layer 38. Whereas in the configuration shown in FIG. 14, the resistance variable layer 36 is formed by two resistance layers including a single layer of the high-resistance layer 37 and a single layer of the low-resistance layer 38, it may be formed to include additional resistance layers.

In the above configuration, the resistance value of the resistance variable layer 36 in the memory portion 35 is increased or reduced by applying electric pulses to the memory portion 35 via the lower electrode 22 and the upper electrode 23. According to the change in the resistance value, data is stored or read out.

Figure 15:
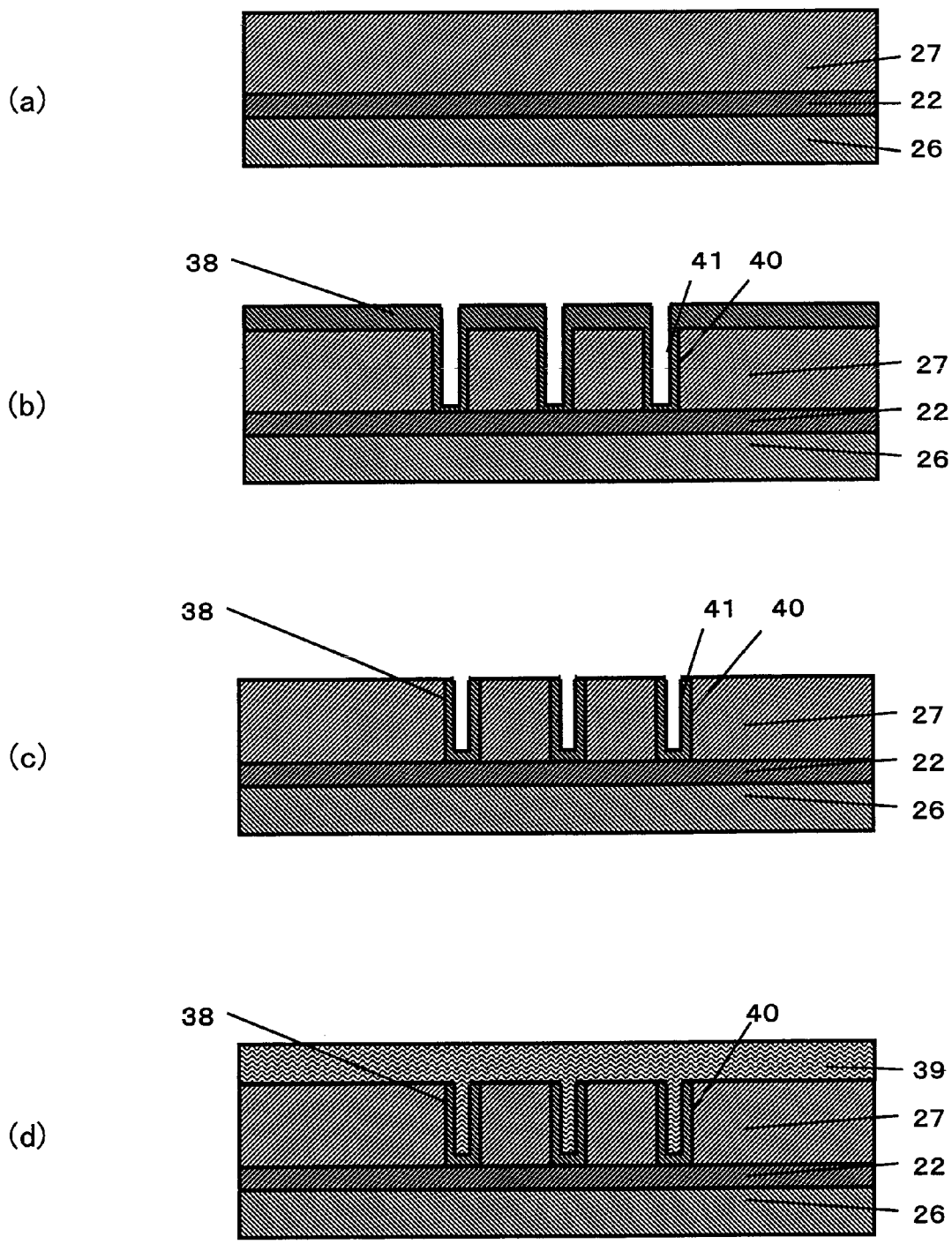
FIGS. 15(a) to 15(d) are step cross-sectional views showing a manufacturing method of the nonvolatile memory element used in Embodiment 2 of the present invention.
Figure 16:
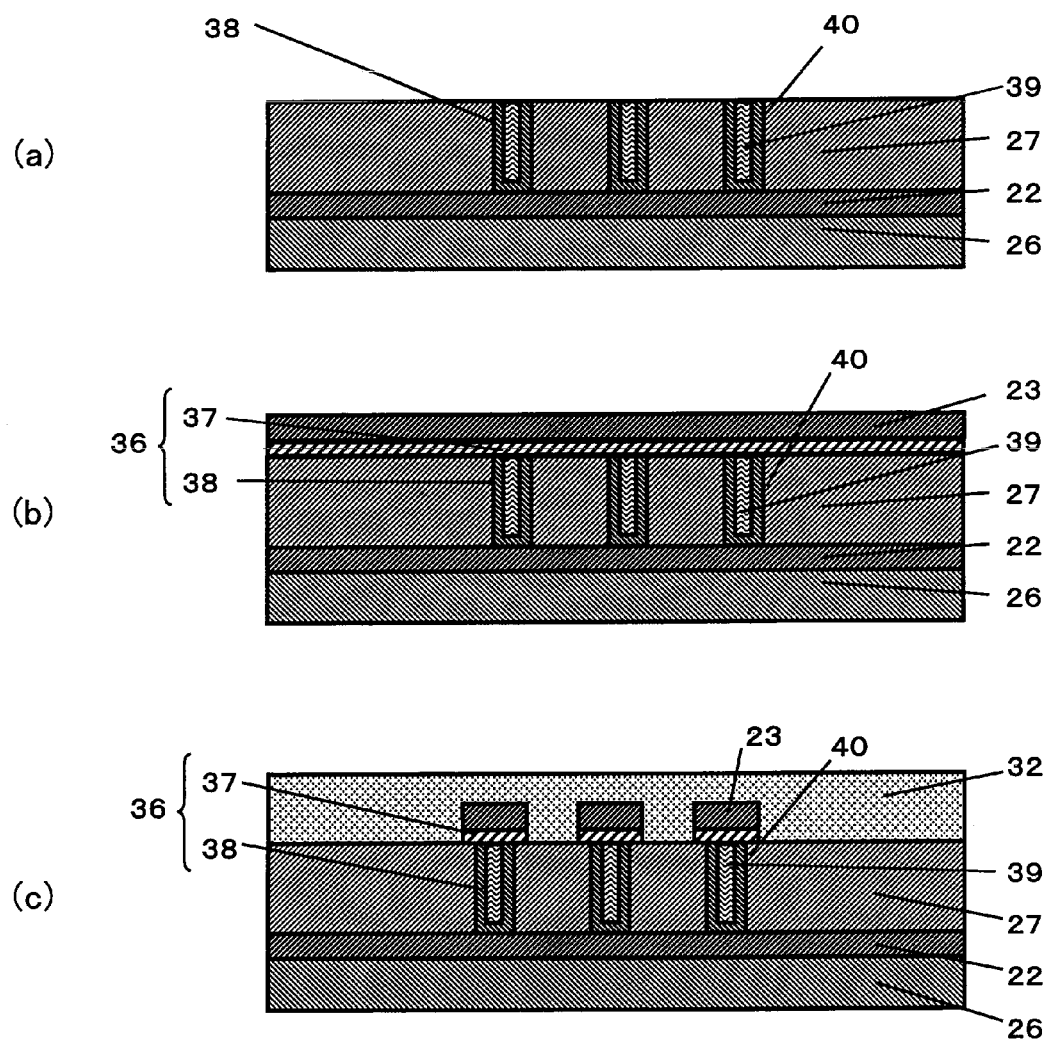
FIGS. 16(a) to 16(c) are step cross-sectional views showing the manufacturing method of the nonvolatile memory element used in Embodiment 2 of the present invention.

The nonvolatile memory element shown in FIG. 14 is manufactured according to the process flow shown in FIGS. 15 and 16.

The step of FIG. 15(a) is identical to that of FIG. 5(a) and will not be described. FIG. 15(b) shows that first contact holes 40 having a diameter of 0.08 μm are formed on the lower electrodes 22 to penetrate through the first interlayer insulating layer 27 of FIG. 15(a), and the low-resistance layers 38 are formed by, for example, a CVD process or plating. The low-resistance layer 38 is made of, for example, $Fe_3O_4$ material and deposited on the side surface and bottom surface of each first contact hole 40 to have a thickness of 30 nm. As shown, a hole 41 is provided inside each first contact hole 40.

A portion of the low-resistance layer 38 which is located on the first interlayer insulating layer 27 and is other than the portion inside the first contact hole 40 is etched back using the CMP technique, thereby forming a cross-sectional structure shown in FIG. 15(c). Then, fluorine-doped embedded insulating layer 39 is embedded to fully fill the hole 41 and deposited to have a thickness of 0.3 μm on the first interlayer insulating layer 27, by the CVD process or the like. A portion of the embedded insulating layer 39 on the first interlayer insulating layer 27 is removed by the CMP technique, thereby flattening the surface of the substrate 26 as shown in FIG. 16(a). Then, as shown in FIG. 16(b), the high-resistance layer 37 and the upper electrode 23 are sequentially deposited on the first interlayer insulating layer 27, the low-resistance layer 38 and the embedded insulating layer 39 as in the process shown in FIG. 5(d). As in the process shown in FIG. 6, the high-resistance layers 37 and the upper electrodes 23 are formed in stripe shape so as to cross the lower electrodes 22 at a right angle, and protectively covered with the second interlayer insulating layer 32 as shown in FIG. 16(c). The resistance variable layer 36 is formed by the multi-layer resistance layer including the low-resistance layer 38 and the high-resistance layer 37.

In such a configuration, since the region where the high-resistance layer and the low-resistance layer are in contact is limited to limit an operating region, the nonvolatile memory element is capable of operating with a lower current and with lower electric power consumption. Therefore, as described in Embodiment 1, the element is miniaturized to a minimum size in a process rule in the manufacturing process. In addition, since the lower electrode 22 and the upper electrode 23 are formed within the first and second interlayer insulating layers, respectively, they can be formed by a mask process (e.g., CMOS process) identical to that for forming functional constituents of the nonvolatile memory element array other than the memory portions. Furthermore, the resistance variable layer 36, i.e., the low-resistance layer 38 and the high-resistance layer 37 can be formed using a normal semiconductor planar process. Moreover, since the surfaces are flattened using the CMP technique before every layer forming step, a close contact state and electric connection state between the layers are favorable.

Therefore, an element structure which is capable of isolating adjacent memory cells and of realizing miniaturization is attainable. In addition, in the cross-point type nonvolatile memory element array, an element structure which is capable of isolating memory cells located adjacent in two-dimensional manner and of realizing further miniaturization is attainable. Furthermore, the first interlayer insulating layer is capable of surely isolating the low-resistance layers in the adjacent memory cells. Thus, the element structure has compatibility with the interlayer insulating layer forming step, the etching step, and the embedding step of the deposited material in the planar process such as the conventional CMOS.

In this embodiment, of course, the advantage similar to that of Embodiment 1 is achieved.

Embodiment 3

Figure 17:
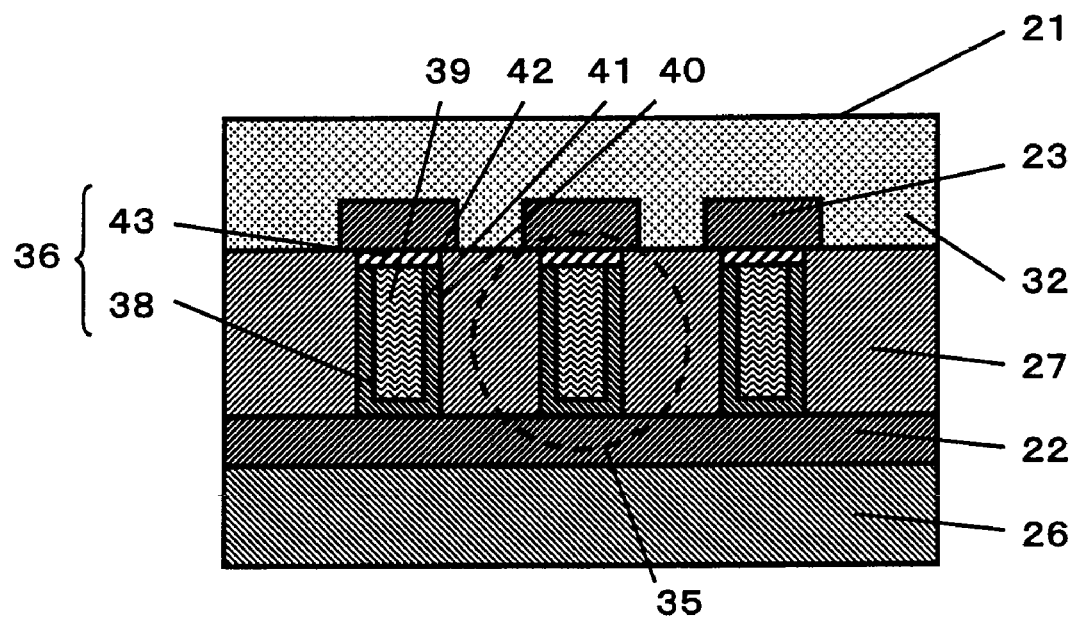
FIG. 17 is a schematic cross-sectional view showing a nonvolatile memory element according to Embodiment 3 of the present invention.

FIG. 17 is a schematic cross-sectional view showing Embodiment 3 of the present invention. The basic configuration of this embodiment is identical to that of Embodiment 2, but this embodiment is different from Embodiment 2 in that a high-resistance layer 43 is embedded to fill first contact hole 40. As shown in FIG. 17, on the substrate 26, the resistance variable layers 36 sandwiched between the lower electrodes 22 and the upper electrodes 23, and a plurality of memory portions 35 (nonvolatile memory elements) including the resistance variable layers 36 are provided. In the structure of FIG. 17, three memory portions 35 are provided. The resistance variable layers 36 are each formed by a multi-layer resistance layer including at least a single layer of a high-resistance layer 43 and a single layer of the low-resistance layer 38, and the low-resistance layer 38 is isolated from at least its adjacent memory portion 35. As in Embodiment 2, this embodiment is different from Embodiment 1 in a structure for connecting the high-resistance layer 43 and the low-resistance layer 38, in which the high-resistance layer 43 is embedded to fully fill a recess 42 inside the first contact hole 40 and the high-resistance layer and the low-resistance layer are connected to each other inside the first contact hole 40.

As shown in FIG. 17, the high-resistance layer 43 is in contact with the low-resistance layer 38 at a surface thereof having a flat cross-sectional shape, while the low-resistance layer 38 is in contact with the high-resistance layer 37 at a surface thereof having a cross-sectional shape formed by rotating 90 degrees a U-shape which opens leftward (e.g., an upper end surface of a cup). To be specific, as shown in FIG. 17, the upper surface of the embedded insulating layer 39 is covered with the lower surface of the high-resistance layer 37, while the side surface and lower surface of the embedded insulating layer 39 are covered with the low-resistance layer 38. Whereas in the configuration shown in FIG. 17, the resistance variable layer 36 is formed by two resistance layers including a single layer of the high-resistance layer 43 and a single layer of the low-resistance layer 38, the resistance variable layer 36 of FIG. 10 may be formed to include additional resistance layers.

In the above configuration, the resistance value of the resistance variable layer 36 in the memory portion 35 is increased or reduced by applying electric pulses to the memory portion 35 via the lower electrode 22 and the upper electrode 23. According to the change in the resistance value, data is stored or read out.

Figure 18:
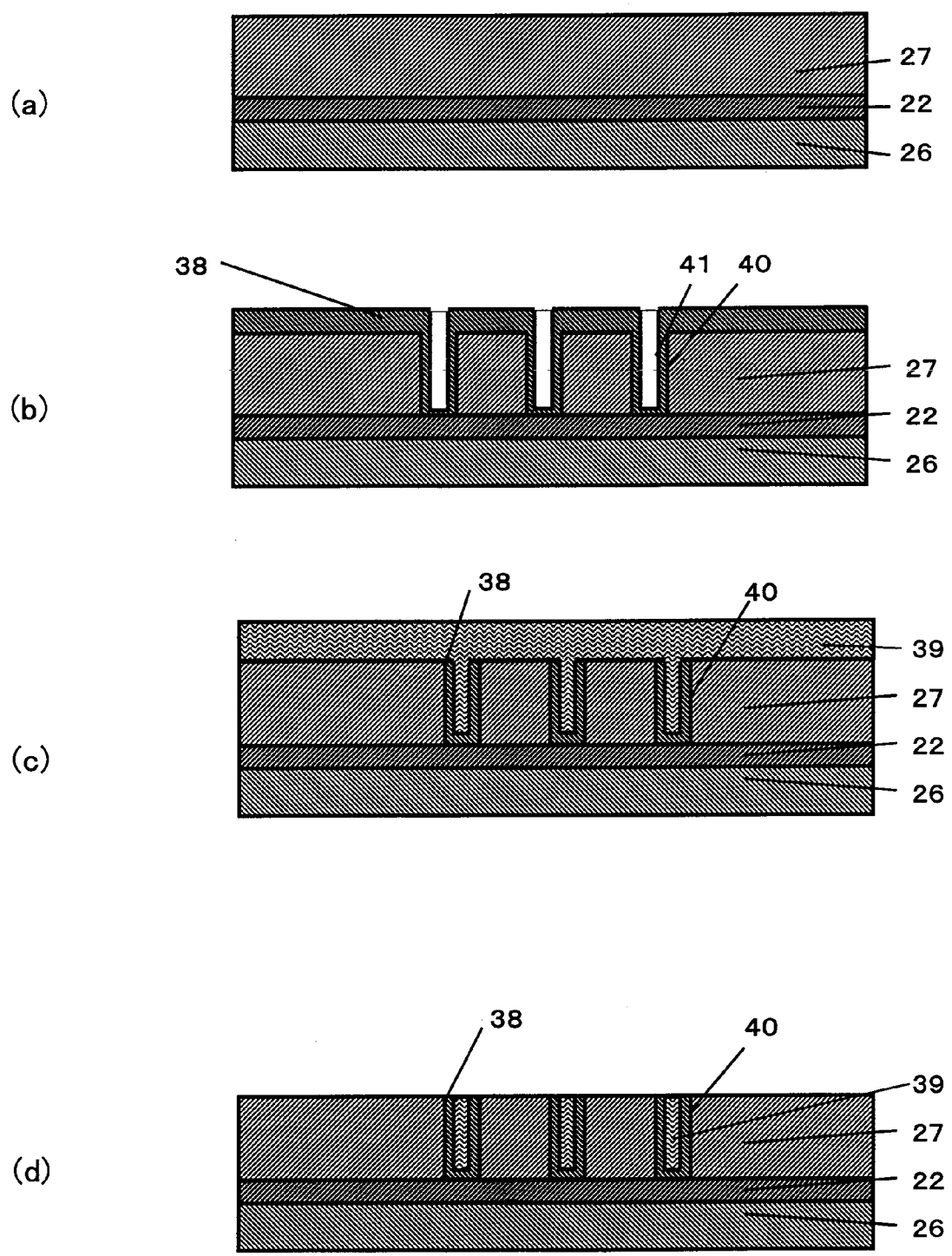
FIGS. 18(a) to 18(d) are step cross-sectional views showing a manufacturing method of the nonvolatile memory element used in Embodiment 3 of the present invention.
Figure 19:
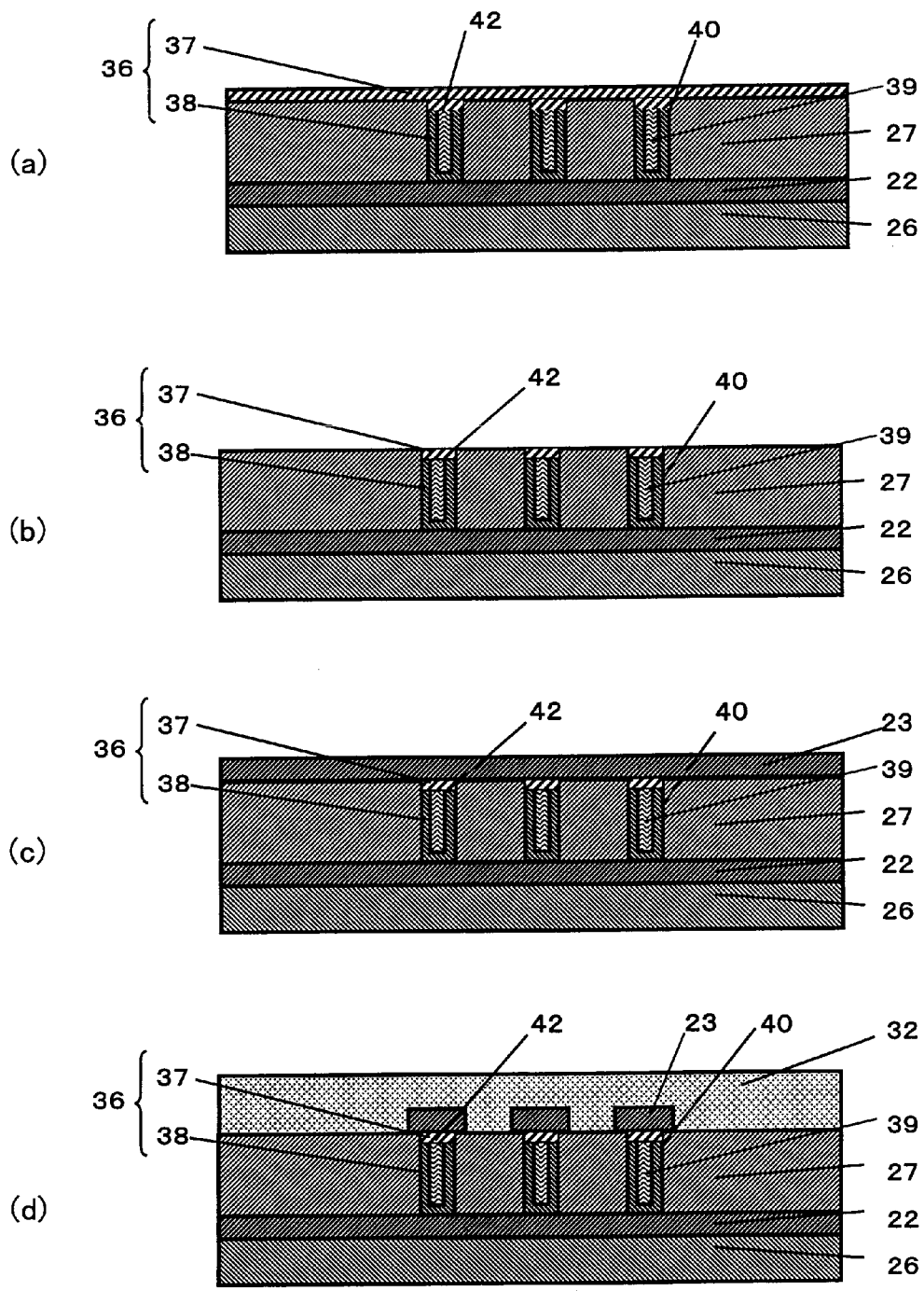
FIGS. 19(a) to 19(c) are step cross-sectional views showing the manufacturing method of the nonvolatile memory element used in Embodiment 3 of the present invention.

The nonvolatile memory element shown in FIG. 17 is manufactured according to the process flow shown in FIGS. 18 and 19.

The process flow shown in FIGS. 15(a) to 15(d) and FIG. 16(a) shown in Embodiment 2 are shown as the process flow in FIGS. 18(a) to 18(d) in this embodiment, and will not described repetitively. In the step of FIG. 19(a), portions of the low-resistance layer 38 and the embedded insulating layer 39 which are embedded to fully fill the first contact hole 40 are removed by the CMP technique or the dry etching in the step of FIG. 18(d), thereby forming a recess 42 having a depth of 10 nm on the upper portion of the first contact hole 40, unlike in Embodiment 2. The high-resistance layer 37 is embedded to fully fill the recess 42 and deposited to have a thickness of 150 nm on the first interlayer insulating layer 27 on the surface of the substrate 26.

Then, by the CMP technique, the portion of the high-resistance layer on the first interlayer insulating layer 27 is removed and only the portion of the high-resistance layer 37 is left in the recess 42, thereby flattening the surface of the substrate 26 as shown in FIG. 19(b). After the upper electrode 23 is formed on the high-resistance layer 37 and the first interlayer insulating layer 27, the stripe-shaped upper electrodes 23 are formed to cross the lower electrodes 22 at a right angle as shown in FIG. 19(c), as in the steps shown in FIGS. 9(c) and 9(d) in Embodiment 1. Then, as shown in FIG. 19(d), the upper electrodes 23 are protectively covered with the second interlayer insulating layer 32. The resistance variable layer 36 is formed by the multi-layer resistance layer including the low-resistance layer 38 and the high-resistance layer 37.

In such a structure, since the region where the high-resistance layer and the low-resistance layer are in contact is limited to limit an operating region, the element is capable of operating with a lower current and with lower electric power consumption. Therefore, as described in Embodiment 1, the element is miniaturized to a minimum size in a process rule in the manufacturing process. In addition, since the lower electrodes 22 and the upper electrodes 23 are formed within the first and second interlayer insulating layers, respectively, they can be formed by a mask process (e.g., CMOS process) identical to that for forming functional constituents of the nonvolatile memory element array other than the memory portions. Furthermore, the resistance variable layer 36, i.e., the low-resistance layer 38 and the high-resistance layer 37 can be formed using a normal semiconductor planar process. Moreover, since the surfaces are flattened using the CMP technique before every layer forming step, a close contact state and electric connection state between the layers are favorable.

Therefore, an element structure which is capable of isolating adjacent memory cells and of realizing further miniaturization is attainable. In addition, in the cross-point type nonvolatile memory element array, an element structure which is capable of isolating memory cells located adjacent in two-dimensional manner and of realizing further miniaturization is attainable. Furthermore, the first interlayer insulating layer is capable of surely isolating the low-resistance layers in the adjacent memory cells. Thus, the element structure has compatibility with the interlayer insulating layer forming step, the etching step, and the embedding step of the deposited material in the planar process such as the conventional CMOS.

In this embodiment, also, of course, the advantage achieved by Embodiment 1 is achieved.

The structures of the nonvolatile memory element described in Embodiment 2 and Embodiment 3 are as a matter of course, applicable to the cross-point structure shown in FIG. 1 and the same advantage is achieved.

Whereas the resistance variable layer is disposed between the upper electrode and the lower electrode in direct contact with them in the structures of the nonvolatile memory element described in Embodiment 1, Embodiment 2, and Embodiment 3, a diode element which is an element used for selecting a memory cell in the cross-point structure may be disposed between the resistance variable layer and the upper electrode or between the resistance variable layer and the lower electrode. At this time, the diode element is operative like a switching element, which is configured to execute control so that the resistance value of the resistance layer changes at a current or higher and does not change at a current or lower. Whereas the nonvolatile memory element has a structure in which the upper electrode and the lower electrode serve as the wires, they may be separately formed and the diode element may be disposed between the electrodes and the wires. Even in the structure in which the diode element intervenes, the advantage of the present invention is well achievable.

(Relationship Between Element Structure and Retention Characteristic)

Figure 20:
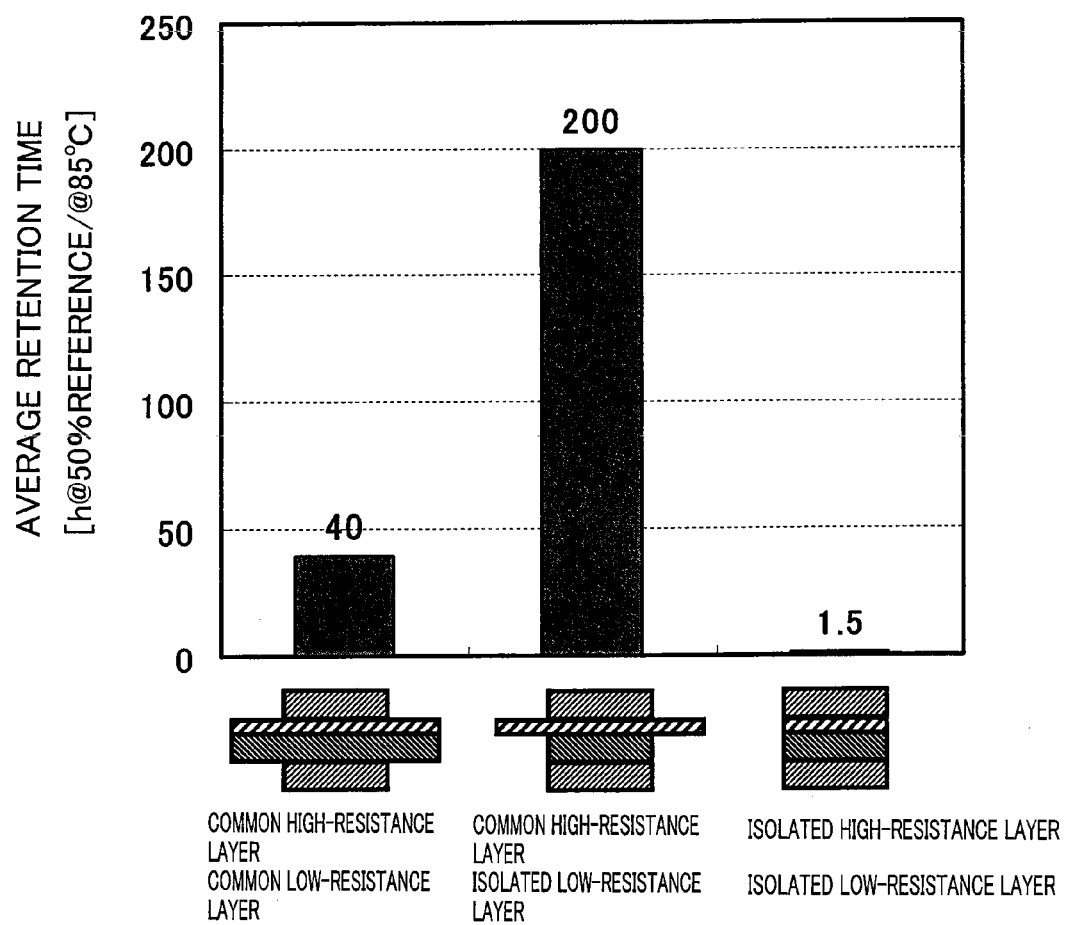
FIG. 20 is a graph showing element structure dependency of retention characteristic.
Figure 21:
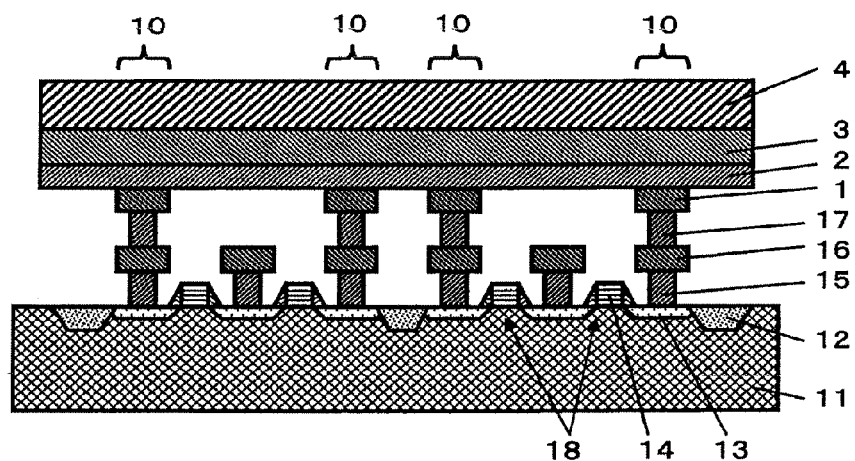
FIG. 21 is a cross-sectional view showing major components of the conventional nonvolatile memory element.

An experiment was conducted to confirm the influence on the retention characteristic which is caused by whether or not the low-resistance layer and the high-resistance layer have an isolated structure. The experimental results are shown in FIG. 20. A horizontal axis indicates schematic cross-sectional views of the element structures. Comparison was made between a sample (a) in which a high-resistance layer is common and a low-resistance layer is common in adjacent memory elements (each of the high-resistance layer and low-resistance layer is not isolated), a sample (b) in which only the low-resistance layer is isolated, and a sample (c) in which each of the high-resistance layer and the low-resistance layer is isolated. As the high-resistance layer, $Fe_2O_3$ was used, while as the low-resistance layer, $Fe_3O$ was used. A vertical axis indicates average retention time in the case where the samples having these element structures are set to a high-resistance value (HR) (initial resistance) and are kept at 85° C. As used herein, the retention time means time which lapses until the initial resistance drops to its half.

As can be clearly seen from FIG. 20, it was found that the structure in which only the low-resistance layer is isolated had data retention time which is as long as 200 hours and is noticeably excellent. This may be due to the fact that diffusion of electrons from an active region of the element to outside is prevented by isolating the low-resistance layer where numerous electrons are present, and thereby changing of the resistance value is prevented. The sample in which each of the low-resistance layer and the high-resistance is isolated had data retention time which was extremely short, to be specific, 1.5 hours. This may be due to the fact that in the case where the high-resistance layer and the low-resistance layer are formed by dry etching, an oxygen-deficiency layer is generated on the end surfaces of these layers at the time of the dry etching. This may generate a path for a leak current, deteriorating the retention characteristic.

From the above experimental result, the fact that especially the element structure in which only the low-resistance layer is isolated (structure in which the low-resistance layer is in contact with only a portion of the main surface of the high-resistance layer) improves the retention characteristic was found out, and therefore, the advantage of the present invention was verified.

In the above experiments, the layer which is not isolated was formed to be continuous in adjacent elements. However, the layer which is not isolated need not be formed to be continuous in adjacent elements. It is presumed that the retention characteristic in the structure in which the high-resistance layer is not isolated but the low-resistance layer is isolated is improved by suppressing the influence of the leak current which would be generated by deterioration of the peripheral portion of the high-resistance layer. From this, for example, in a structure in which the lower surface of the high-resistance layer is larger in area than the upper surface of the low-resistance layer and the peripheral portion of the high-resistance layer protrudes from the upper surface of the low-resistance layer (contact hole in which the low-resistance layer is formed), a current flows to the low-resistance layer through a center portion of the high-resistance layer. It is presumed that in such a configuration, the influence of the deteriorated portion in the end surface (e.g., portion of the high-resistance layer where oxygen atoms migrate to its surrounding region and the resistance value is lowered) is less, and the retention characteristic is improved.

In the examples of the experiment, the etching was used for the isolation of the element. It may be considered that in the structure in which each of the low-resistance layer and the high-resistance layer is isolated, the peripheral portions are deteriorated due to the dry etching, causing deterioration of the retention characteristic. On the other hand, in the structure in which the low-resistance layer and the high-resistance layer are deposited inside the contact hole as shown in FIG. 9, deterioration due to the dry etching will not occur. Therefore, with the structure shown in FIG. 9, it is possible to satisfactorily achieve the advantage (high-speed operation at a low voltage and suppression of the cross talk) provided by providing the high-resistance layer and the low-resistance layer and then isolating the low-resistance layer. Nonetheless, the structure in which the low-resistance layer is connected to only a portion of the main surface of the high-resistance layer as illustrated by the above experiment example is desirably used if deterioration of the peripheral portion is problematic.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention provides a large-capacity nonvolatile memory element which achieves high-density integration, and a manufacturing method thereof, and is useful in achieving small-size and thinness in electronic hardware such as portable information devices or information home appliances.

The invention claimed is:

1. A nonvolatile memory element array comprising a plurality of nonvolatile memory elements, each of the nonvolatile memory elements including:
   a lower electrode provided on a substrate;
   an upper electrode provided above the lower electrode;
   a resistance variable layer sandwiched between the lower electrode and the upper electrode;
   wherein the resistance variable layer includes a high-resistance layer and a low-resistance layer;
   wherein the resistance variable layer has a characteristic in which a resistance value of the resistance variable layer is increased or reduced by applying electric pulses between the lower electrode and the upper electrode; and
   wherein the resistance variable layer is connected to the upper electrode only at a portion of a main surface of the upper electrode or connected to the lower electrode only at a portion of a main surface of the lower electrode; and
   a first interlayer insulating layer provided on the substrate to cover the lower electrode, wherein a first contact hole is provided on the lower electrode to penetrate through the first interlayer insulating layer;
   wherein the low-resistance layer is provided inside the first contact hole such that low-resistance layers in adjacent nonvolatile memory elements are isolated from each other;
   and wherein the high-resistance layer is provided outside the first contact hole to have a size larger than a diameter of the first contact hole.

2. The nonvolatile memory element array according to claim 1, wherein
   the low-resistance layer is connected to the high-resistance layer only at a portion of a main surface of the high-resistance layer.

3. The nonvolatile memory element array according to claim 1, which is being a cross-point type nonvolatile memory element,
   wherein a plurality of lower electrodes are arranged to extend in parallel with each other within a first plane which is parallel to a main surface of the substrate;
   wherein a plurality of upper electrodes are arranged to extend in parallel with each other within a second plane which is parallel to the first plane and to three-dimensionally cross the lower-electrodes;
   wherein the resistance variable layer is provided between the lower electrode and the upper electrode so as to correspond to each of three-dimensional cross points of the plurality of lower electrodes and the plurality of upper electrodes; and
   wherein the nonvolatile memory element is provided to correspond to each of the three-dimensional cross points.

4. The nonvolatile memory element array according to claim 1, wherein the high-resistance layer in adjacent nonvolatile memory elements is provided to extend continuously.

5. The nonvolatile memory element array according to claim 1, wherein
   the low-resistance layer has a resistivity which is not lower than $1\times10^{-3}$ Ωcm and not higher than $2\times10^{-2}$ Ωcm.

6. The nonvolatile memory element array according to claim 1, wherein the high-resistance layer has a resistivity which is not lower than 0.13 Ωcm and not higher than 250 Ωcm.

7. The nonvolatile memory element array according to claim 1, wherein the low-resistance layer is a layer containing $Fe_3O_4$.

8. The nonvolatile memory element array according to claim 1, wherein the high-resistance layer is a layer containing at least one material which is selected from a group consisting of $Fe_2O_3$, $ZnFe_2O_4$, $MnFe_2O_4$, and $NiFe_2O_4$.

9. The nonvolatile memory element array according to claim 1, further comprising:
   an embedded insulating layer which is formed by an insulator embedded in the low-resistance layer;
   wherein an upper surface of the embedded insulating layer is connected to a portion of a lower surface of the high-resistance layer, and a side surface and a lower surface of the embedded insulating layer are covered with the low-resistance layer.

* * * * *